(12) United States Patent
Kim et al.

(10) Patent No.: US 11,324,135 B2
(45) Date of Patent: May 3, 2022

(54) ELECTRONIC DEVICE INCLUDING KEY ASSEMBLY

(71) Applicant: Samsung Electronics Co., Ltd., Gyeonggi-do (KR)

(72) Inventors: Hosu Kim, Gyeonggi-do (KR); Jongchun Wee, Gyeonggi-do (KR); Kyungpil Kim, Gyeonggi-do (KR); Namjun Kim, Gyeonggi-do (KR)

(73) Assignee: Samsung Electronics Co., Ltd

( * ) Notice: Subject to any disclaimer, the term of this patent is extended or adjusted under 35 U.S.C. 154(b) by 89 days.

(21) Appl. No.: 16/794,830

(22) Filed: Feb. 19, 2020

(65) Prior Publication Data

US 2020/0267863 A1    Aug. 20, 2020

(30) Foreign Application Priority Data

Feb. 19, 2019    (KR) ......................... 10-2019-0019402

(51) Int. Cl.
*H05K 1/00* (2006.01)
*H05K 5/06* (2006.01)
(Continued)

(52) U.S. Cl.
CPC ............ *H05K 5/061* (2013.01); *H04M 1/026* (2013.01); *H05K 1/0281* (2013.01); *H05K 1/189* (2013.01);
(Continued)

(58) Field of Classification Search
CPC ...... H05K 5/061; H05K 1/189; H05K 1/0281; H05K 5/069; H05K 5/0004;
(Continued)

(56) References Cited

U.S. PATENT DOCUMENTS

2007/0171208 A1    7/2007    Sung et al.
2010/0213041 A1    8/2010    Chen et al.
(Continued)

FOREIGN PATENT DOCUMENTS

KR    10-0672609    1/2007
KR    1020140034625    3/2014
(Continued)

OTHER PUBLICATIONS

International Search Report dated May 29, 2020 issued in counterpart appln. No. PCT/KR2020/002252, 9 pages.
(Continued)

*Primary Examiner* — Andargie M Aychillhum
(74) *Attorney, Agent, or Firm* — The Farrell Law Firm, P.C.

(57) ABSTRACT

An electronic device is provided, which includes a housing including a sidewall; a through-hole configured to penetrate the sidewall; an assembling hole formed adjacent to the through-hole inside the housing; a key assembly configured to be received in the assembling hole and disposed to face an inner surface of the housing in an area where the through-hole is positioned; and a fixing member configured to be received in the assembling hole and to bring a surface of the key assembly into close contact with the inner surface of the housing around the through-hole and seal between the through-hole and an inner space of the housing.

20 Claims, 11 Drawing Sheets

(51) Int. Cl.
*H05K 1/18* (2006.01)
*H05K 1/02* (2006.01)
*H04M 1/02* (2006.01)
*H05K 5/00* (2006.01)

(52) U.S. Cl.
CPC ........... *H05K 5/0004* (2013.01); *H05K 5/069* (2013.01); *H05K 2201/10053* (2013.01); *H05K 2201/2009* (2013.01)

(58) Field of Classification Search
CPC . H05K 2201/10053; H05K 2201/2009; H05K 2201/056; H05K 2201/052; H04M 1/026; H04M 1/236
USPC .......................................................... 361/749
See application file for complete search history.

(56) References Cited

U.S. PATENT DOCUMENTS

| | | | |
|---|---|---|---|
| 2013/0299324 A1 | 11/2013 | Kanbayashi et al. | |
| 2014/0307370 A1* | 10/2014 | Zadesky | H05K 5/0217 361/679.01 |
| 2014/0367237 A1* | 12/2014 | Taylor | H01H 15/02 200/5 A |
| 2016/0086745 A1 | 3/2016 | Seo et al. | |
| 2016/0233037 A1* | 8/2016 | Lee | H01H 1/5805 |
| 2017/0118319 A1 | 4/2017 | Jun et al. | |
| 2018/0183912 A1 | 6/2018 | Lim et al. | |
| 2018/0218194 A1 | 8/2018 | Lee et al. | |
| 2018/0358190 A1* | 12/2018 | Lee | H04M 1/23 |
| 2020/0194879 A1* | 6/2020 | Lim | H01Q 1/243 |
| 2020/0265204 A1* | 8/2020 | Lee | H04M 1/0266 |
| 2020/0265212 A1* | 8/2020 | Jung | G06K 9/00053 |

FOREIGN PATENT DOCUMENTS

| | | |
|---|---|---|
| KR | 1020190037967 | 4/2019 |
| WO | WO 2016/039787 | 3/2016 |

OTHER PUBLICATIONS

European Search Report dated Dec. 15, 2021 issued in counterpart appln. No. 20759041.5-1216, 9 pages.

\* cited by examiner

ELECTRONIC DEVICE INCLUDING KEY ASSEMBLY

CROSS-REFERENCE TO RELATED APPLICATION(S)

This application is based on and claims priority under 35 U.S.C. § 119 to Korean Patent Application No. 10-2019-0019402, filed on Feb. 19, 2019, in the Korean Intellectual Property Office, the entire disclosure of which is incorporated herein by reference.

BACKGROUND

1. Field

The disclosure relates generally to an electronic device and, more particularly, to an electronic device including a key assembly.

2. Description of the Related Art

Over time, various functions have been integrated into an electronic device. For example, a smart phone includes an audio reproducing function, an imaging function, an electronic notebook function, etc., as well as a communication function. Additionally, functions may be implemented in the smart phone through additional installation of applications.

An electronic device may receive various information in real-time by accessing a server or another electronic device in a wired or wireless manner as well as executing an installed application or a stored file.

As a user carries and uses an electronic device on a daily basis, the electronic device may be exposed to various environments. For example, as the living space of the user changes, the electronic device may be exposed to a harsh environment, experiencing high humidity and/or air pollution. High humidity or contaminated air may contaminate or corrode various electronic components and wiring in the electronic device.

If an electronic device is expected to be exposed to a large amount of moisture, a user can protect the electronic device from the moisture by using aftermarket products (e.g., dustproof and waterproof bags). However, such aftermarket products may cause an economic burden on the user and may impair the convenience of using the electronic device.

Manufacturers may increase the reliability of electronic devices by installing dustproof and waterproof elements for preventing internal contamination of the electronic devices. For example, by arranging an adhesive member or a sealing member between two mechanically coupled parts, it is possible to block the inflow of moisture or foreign substances from the outside. However, some keys provided for user input may have a mechanical operating structure, and in this mechanical operating structure, a waterproof structure may be exposed to a risk of damage. For example, a waterproof structure may interfere with other structures and be damaged during an initial assembly process or during a separation or assembly process for repair.

SUMMARY

The disclosure is made to address at least the above-mentioned problems and/or disadvantages and to provide at least the advantages described below.

An aspect of the disclosure is to provide a key assembly that prevents damage to a waterproof structure while assembling or detaching the key assembly into or from a housing, or an electronic device including the same.

Another aspect of the disclosure is to provide a key assembly that is easily assembled into or detached from a housing and prevents damage to a waterproof structure during a repair process, or an electronic device including the same.

In accordance with an aspect of the disclosure, an electronic device includes a housing configured to include a first surface facing a first direction, a second surface facing a second direction opposite the first direction, and a sidewall at least partially surrounding a space between the first surface and the second surface; at least one through-hole configured to penetrate the sidewall; an assembling hole configured to be formed adjacent to the through-hole inside the housing; a key assembly configured to be received in the assembling hole and to be disposed to face an inner surface of the housing in an area where at least the through-hole is positioned; and a fixing member configured to be received in the assembling hole and to bring the key assembly into close contact with the inner surface of the housing, wherein one surface of the key assembly is brought into close contact with the inner surface of the housing around at least the through-hole to seal between the through-hole and an inner space of the housing.

In accordance with another aspect of the disclosure, an electronic device includes a housing configured to include a through-hole formed to penetrate a sidewall and an assembling hole formed adjacent to the through-hole on an inner side of the sidewall; a key assembly configured to be received in the assembling hole and to be disposed to face an inner surface of the housing in an area in which the through-hole is positioned, wherein the key assembly includes a sealing member configured to be brought into close contact with the inner surface of the housing, a flexible printed circuit board configured to be coupled to face the sealing member, at least one switch member configured to be provided on one surface of the flexible printed circuit board and to be aligned with the through-hole while facing the sealing member, and a reinforcing member configured to be coupled to face the other surface of the flexible printed circuit board; a fixing member configured to be received in the assembling hole, wherein the fixing member includes a fixing plate configured to be disposed between the inner wall of the assembling hole and the reinforcing member, a first bent portion configured to be bent at both ends of the fixing plate, and a second bent portion configured to be bent at an edge of an upper portion of the fixing plate, wherein, when the fixing member is assembled to the assembling hole, the fixing plate and the first bent portion are supported on the inner wall of the assembling hole and the second bent portion is positioned to surround a portion of an edge of the key assembly to restrict the key assembly inside the assembling hole, and the sealing member is brought into close contact with the inner surface of the housing around at least the through-hole to seal between the through-hole and an inner space of the housing.

In accordance with another aspect of the disclosure, an electronic device includes a housing configured to include a front plate, a rear plate facing a direction opposite a direction of the front plate, and a side bezel structure surrounding a space between the front plate and the rear plate, wherein the side bezel structure includes an outer surface, an inner surface, and at least one through-hole extending from the outer surface to the inner surface; an intermediate plate configured to extend from the inner surface of the side bezel structure between the front plate and the rear plate, wherein the intermediate plate forms an elongated recess together with the side bezel structure at a position adjacent to the through-hole when viewed from above the front plate or the rear plate, and the elongated recess includes an inner wall facing the side bezel structure and a bottom surface facing the front plate or the rear plate; a display configured to be disposed between the intermediate plate and the front plate and to be displayed to the outside through the front plate; a circuit structure configured to be received in the elongated recess and to include at least one dome key structure disposed to face the through-hole; an elastic member configured to be received in the elongated recess, to be disposed between the circuit structure and the inner surface of the side bezel structure, and to contact the inner surface of the side bezel structure to seal the through-hole; a metal member configured to be received in the elongated recess and to be disposed between an inner wall of the elongated recess and the circuit structure while contacting the inner wall of the elongated recess; a spacer member configured to be received in the elongated recess and to be disposed to contact the metal member and the circuit structure between the metal member and the circuit structure; and at least one button structure configured to be received in the through-hole.

BRIEF DESCRIPTION OF THE DRAWINGS

The above and other aspects, features, and advantages of certain embodiments of the disclosure will be more apparent from the following detailed description taken in conjunction with the accompanying drawings, in which.

DETAILED DESCRIPTION

Figure 1:
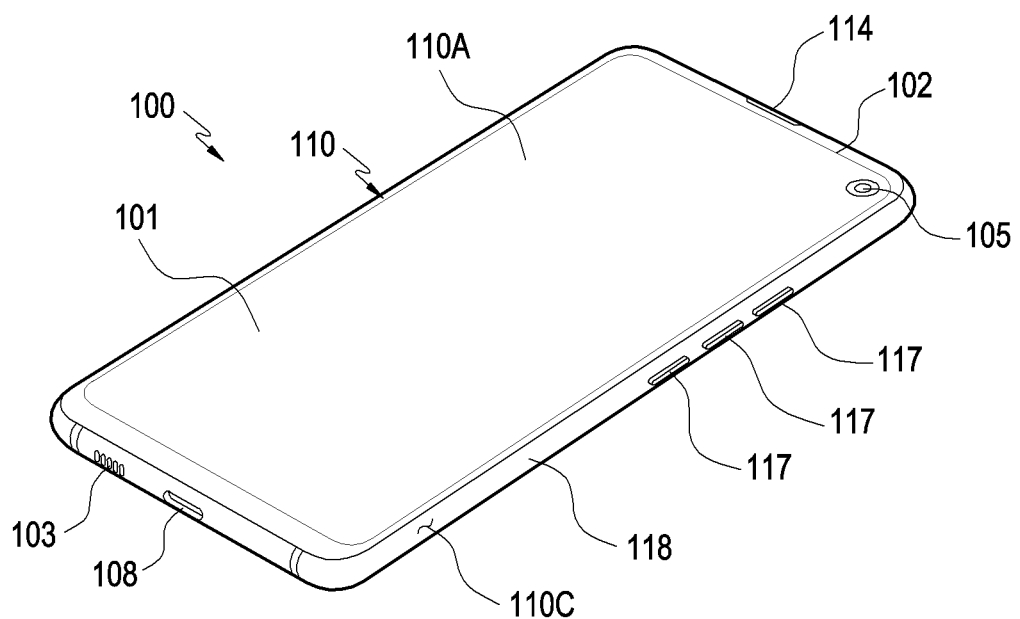
FIG. 1 illustrates an electronic device according to an embodiment.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be is understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if any one element (e.g., first element) is referred to, with or without the term "operatively" or "communicatively", as "coupled with," "coupled to," "connected with," or "connected to" another element (e.g., second element), the element may be coupled with the other element directly (e.g., wiredly), wirelessly, or via a third element.

As used herein, the term "module" may include a unit implemented in hardware, software, or firmware, and may interchangeably be used with other terms such as "logic", "logic block", "part", or "circuitry". A module may be a single integral component, or a minimum unit or part thereof, adapted to perform one or more functions, and may be implemented in a form of an application-specific integrated circuit (ASIC).

Various embodiments of the disclosure may be implemented as software including one or more instructions that are stored in a storage medium (e.g., internal memory or external memory) that is readable by a machine (e.g., electronic device). For example, a processor of the machine (e.g., electronic device) may invoke and execute at least one of the one or more instructions stored in the storage medium. This may enable the machine to be operated to perform at least one function according to the invoked at least one instruction. The one or more instructions may include a code generated by a complier or a code executable by an interpreter. The machine-readable storage medium may be provided in the form of a non-transitory storage medium. The term "non-transitory" indicates that the storage medium is a tangible device, and does not include a signal (e.g., an electromagnetic wave), but does not differentiate between where data is semi-permanently and temporarily stored in the storage medium.

A method according to embodiments of the disclosure may be included and provided in a computer program product. The computer program product may be traded as commodities between sellers and buyers. The computer program product may be distributed in the form of a machine-readable storage medium (e.g., compact disc read only memory (CD-ROM)), or may be distributed (e.g., downloaded or uploaded) online via an application store (e.g., Play Store™), or directly between two user devices (e.g., smart phones). If distributed online, at least part of the computer program product may be temporarily generated or at least temporarily stored in the machine-readable storage medium, such as memory of the manufacturer's server, a server of the application store, or a relay server.

According to various embodiments, each component (e.g., module or program) of the above-described components may include a single entity or multiple entities. According to various embodiments, one or more of the above-described components may be omitted, or one or more other components may be added. Alternatively or additionally, a plurality of components (e.g., module or program) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be performed sequentially, in parallel, repeatedly, or heuristically, one or more of the operations may be executed in a different order or omitted, or other operations may be added.

Figure 2:
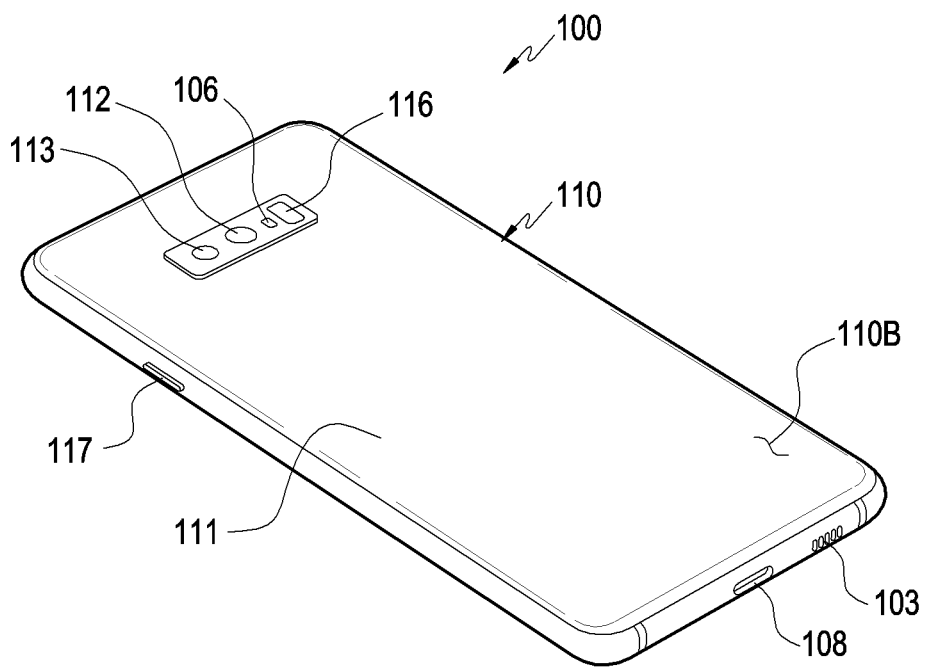
FIG. 2 illustrates the electronic device of FIG. 1 as viewed from the back side.

FIG. 1 illustrates an electronic device according to an embodiment. FIG. 2 illustrates the electronic device of FIG. 1 as viewed from the back side.

Referring to FIGS. 1 and 2, an electronic device 100 includes a housing having a first surface (or front surface) 110A, a second surface (or rear surface) 110B, and a side surface (or sidewall) 110C surrounding a space between the first surface 110A and the second surface 110B. Alternatively, the housing may refer to a structure that forms some of the first surface 110A, the second surface 110B, and the side surface 110C of FIG. 1.

The first surface 110A may be formed by a front plate 102 (e.g., a glass plate including various coating layers or a polymer plate) of which at least a portion is substantially transparent. The front plate 102 may include a curved portion formed on at least one side edge portion thereof, which is bent toward a rear plate 111 from the first surface 110A and seamlessly extends.

The second surface 110B may be formed by the substantially opaque back plate 111. The rear plate 111 may be formed by coated or colored glass, ceramic, polymer, metal (e.g., aluminum, stainless steel (STS), or magnesium), or a combination of at least two of the above materials. The rear plate 111 may include a curved portion formed on at least one side edge portion thereof, which is bent toward the front plate 102 from the second surface 110B and seamlessly extends.

The side surface 110C may be coupled to the front plate 102 and the rear plate 111, and may be formed by a side bezel structure (or a side member or a side wall) 118 that includes metal and/or polymer. Alternatively, the rear plate 111 and the side bezel structure 118 may be integrally formed and may include the same material (e.g., a metal material such as aluminum).

The electronic device 100 includes a display 101, an audio module 103 or 114, a sensor module, a camera module 105, a key input device 117, and a connector hole 108. Alternatively, the electronic device 100 may omit at least one of the components (e.g., the key input device 117) or may further include other components. The electronic device 100 may include a sensor module. For example, in an area provided by the front plate 102, a sensor such as a proximity sensor or an illuminance sensor may be integrated into the display 101 or disposed at a position adjacent to the display 101. The electronic device 100 may also include a light emitting device, and the light emitting device may be disposed at a position adjacent to the display 101 in the area provided by the front plate 102. The light emitting device may provide state information of the electronic device 100 in the form of light. The light emitting device may provide a light source that is linked to the operation of the camera module 105. The light emitting device may include a light emitting diode (LED), an infrared (IR) LED, and a xenon lamp.

The display 101 may be exposed through a portion of the front plate 102. An edge of the display 101 may be formed to be substantially the same as an adjacent outer shape (e.g., curved surface) of the front plate 102. In order to expand an area where the display 101 is exposed, a distance between the outer side of the display 101 and the outer side of the front plate 102 may be formed to be substantially the same. A recess or an opening may be formed in a portion of a screen display area of the display 101, and other electronic components may be provided within the recess or the opening, e.g., the camera module 105, a proximity sensor, or an illuminance sensor.

At least one or more of a camera module 112 or 113, a fingerprint sensor 116, and a flash 106 may be included on the rear surface of the screen display area of the display 101. The display 101 may be coupled to or disposed adjacent to a touch sensing circuit, a pressure sensor capable of measuring the strength (pressure) of a touch, and/or a digitizer for detecting a magnetic field type-stylus pen.

The audio modules 103 and 114 may include microphone holes and speaker holes. The microphone hole may have a microphone disposed therein to obtain external sounds, and a plurality of microphones may be disposed to detect the direction of a sound. The speaker hole and the microphone hole may be implemented as a single hole 103, or a speaker (e.g., piezo speaker) may be included without the speaker hole. The speaker hole may include an external speaker hole and a call receiver hole 114.

The electronic device 100 may include a sensor module in order to generate an electrical signal or data value corresponding to an internal operating state or external environmental state of the electronic device 101. The sensor module may further include a proximity sensor disposed on the first surface 110A of the housing 110, a fingerprint sensor integrated into or disposed adjacent to the display 101, and/or a biometric sensor (e.g., a heart rate monitor (HRM) sensor) disposed on the second surface 110B of the housing 110. The electronic device 100 may further include a sensor module, such as a gesture sensor, a gyro sensor, an atmospheric pressure sensor, a magnetic sensor, an acceleration sensor, a grip sensor, a color sensor, an IR sensor, a biometric sensor, a temperature sensor, a humidity sensor, and/or as an illuminance sensor.

The camera modules 105, 112, 113, and 106 may include a first camera device 105 disposed on the first surface 110A of the electronic device 100, second camera devices 112 and 113 disposed on the second surface 110B, and/or a flash 106. The camera devices 105, 112, and 113 may include one or a plurality of lenses, an image sensor, and/or an image signal processor. The flash 106 may include an LED or a xenon lamp. Two or more lenses (an IR camera, a wide-angle lens, and a telescopic lens) and image sensors may be disposed on one side of the electronic device 100.

The key input device 117 may be disposed on the side surface 110C of the housing 110. The electronic device 100 may exclude all or some of the above-mentioned key input devices 117 and the excluded key input devices 117 may be implemented in other forms, such as soft keys, on the display 101. The key input device may include at least some of the fingerprint sensors 116 disposed on the second surface 110B of the housing 110.

The connector hole 108 may receive a connector for transmitting and receiving power and/or data to and from an external electronic device, and/or a connector for transmitting and receiving an audio signal to and from an external electronic device. For example, the connector hole 108 may include a universal serial bus (USB) connector or an earphone jack.

Figure 3:
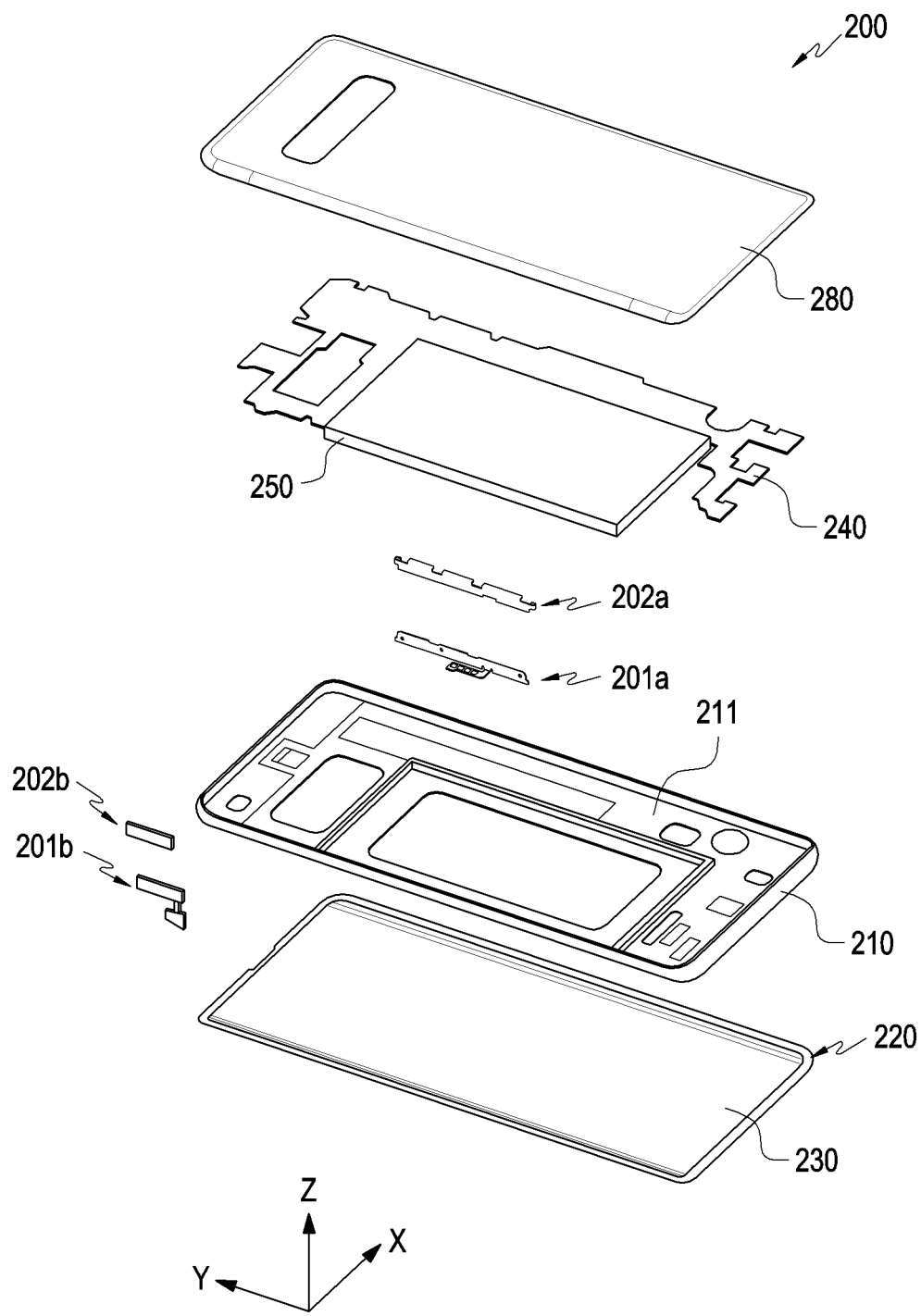
FIG. 3 illustrates an exploded perspective view of an electronic device according to an embodiment.

FIG. 3 illustrates an exploded perspective view of an electronic device according to an embodiment.

Referring to FIG. 3, an electronic device 200 includes a side bezel structure 210, an intermediate plate, e.g., a first support member 211 (e.g., a bracket), a front plate 220, a display 230, a printed circuit board 240, a battery 250, and a rear plate 280. Alternatively, the electronic device 200 may omit at least one of the components (e.g., the first support member 211) or may additionally include other components. The at least one of the components of the electronic device 200 may be the same as or similar to at least one of the components of the electronic device 100 of FIG. 1 or 2, and overlapping descriptions thereof will be omitted below.

The first support member 211 may be disposed inside the electronic device 200 to be connected to the side bezel structure 210 or may be integrally formed with the side bezel structure 210. The first support member 211 may be made of a metal material and/or a nonmetal (e.g., polymer) material. In the first support member 211, a display 230 may be coupled to one surface thereof, and the printed circuit board 240 may be coupled to the other surface thereof. The printed circuit board 240 may be equipped with a processor, a memory, and/or an interface. The processor may include one or more of a central processor (CP), an application processor (AP), a graphics processor, an image signal processor, a sensor hub processor, or a communication processor.

The memory may include a volatile memory or a non-volatile memory.

The interface may include a high definition multimedia interface (HDMI), a USB interface, a secure digital (SD) card interface, and/or an audio interface. The interface may electrically or physically connect the electronic device 200 to an external electronic device, and may include a USB connector, an SD card/multimedia card (MMC) connector, or an audio connector.

The battery 250 supplies power to at least one component of the electronic device 200, and may include a non-rechargeable primary cell, a rechargeable secondary cell, and/or a fuel cell. At least a portion of the battery 250 may be disposed on substantially the same plane as the printed circuit board 240. The battery 250 may be integrally disposed inside the electronic device 200 or may be disposed to be detachable from the electronic device 200.

The electronic device 200 includes key assemblies 201a and 201b and fixing members 202a and 202b provided as part of a key input device. The key assembly may include a first key assembly 201a disposed on one side of a housing, e.g., the side bezel structure 210, and a second key assembly 201b disposed on the other side of the side bezel structure 210. The fixing member may include a first fixing member 202a corresponding to the first key assembly 201a and a second fixing member 202b corresponding to the second key assembly 201a.

The first key assembly 201a may be disposed to face the inner surface of the housing 110, e.g., the inner surface of the side bezel structure 210. The first fixing member 202a may be disposed inside the housing 110 to bring the first key assembly 201a into close contact with the inner surface of the housing 110. The second key assembly 201b may be disposed to face another portion on the inner side of the housing 110 and may be brought into close contact with the inner surface of the housing 110 by the second fixing member 202b. The first key assembly 201a may include, a pair of volume control keys and a power key (or a hot key), and the second key assembly 201b may include a hot key (or a power key). The "hot key" may have a function of immediately activating a voice assistant function and a camera function. The function of the hot key may vary depending on the user's settings.

The first key assembly 201a and the second key assembly 202a may differ in the number of keys or a number of switch members, and may be the same in other structures.

Figure 4:
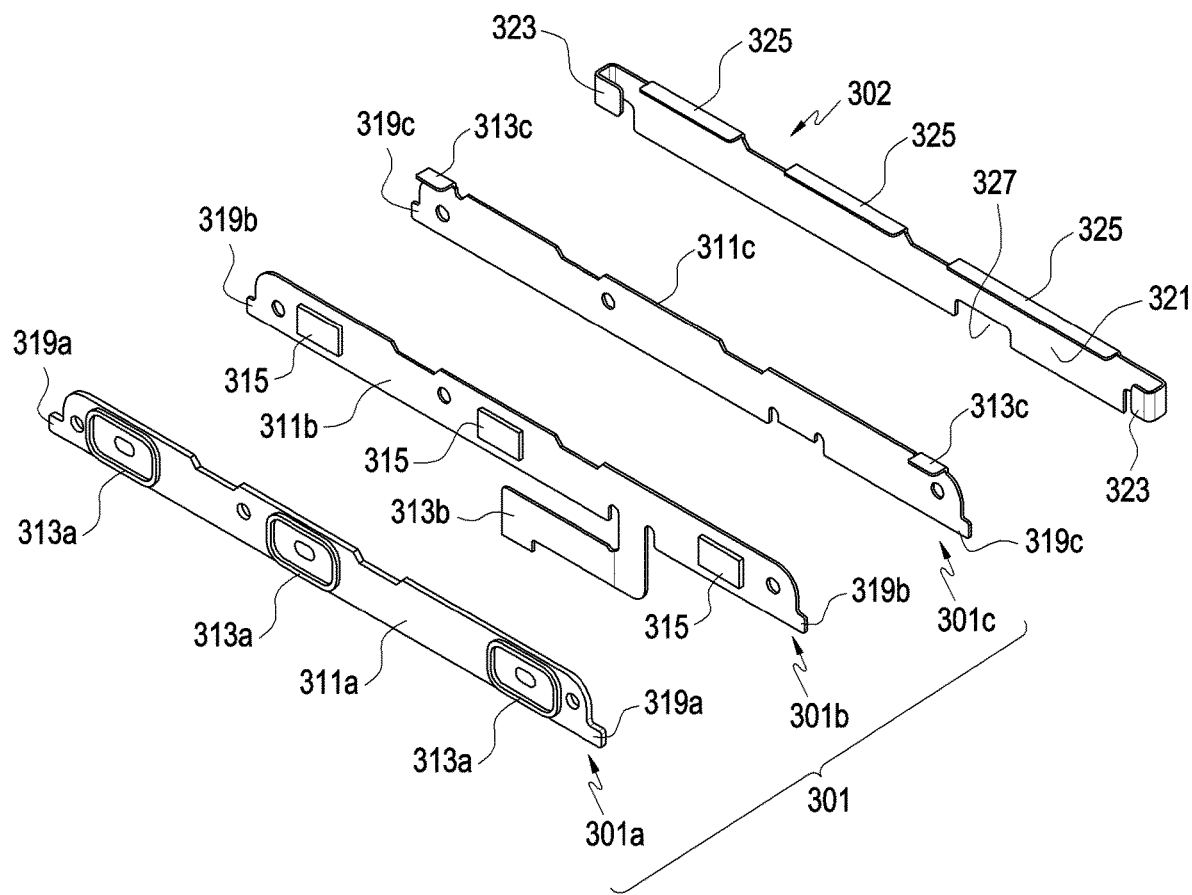
FIG. 4 illustrates an exploded perspective view of a key assembly and a fixing member of an electronic device according to an embodiment.

FIG. 4 illustrates an exploded perspective view of a key assembly and a fixing member of an electronic device according to an embodiment.

Figure 5:
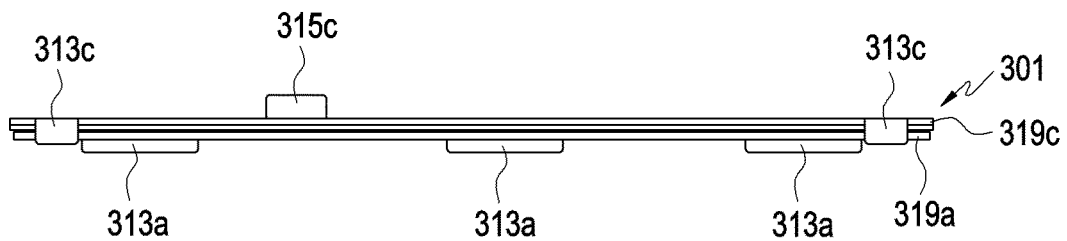
FIG. 5 illustrates a key assembly of an electronic device according to an embodiment.
Figure 6:
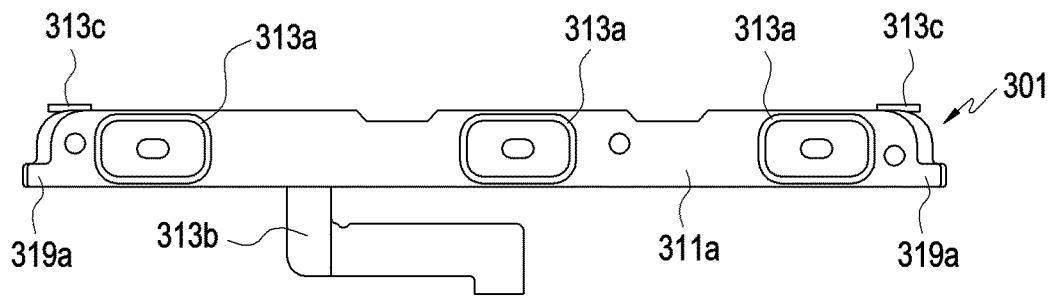
FIG. 6 illustrates a front view of a key assembly of an electronic device according to an embodiment.
Figure 7:
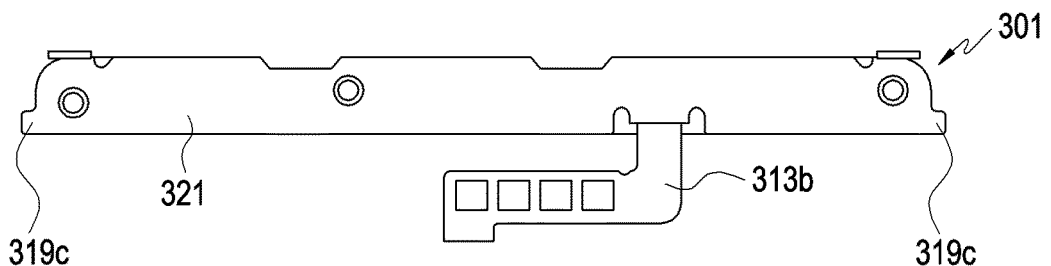
FIG. 7 illustrates a rear view of a key assembly of an electronic device according to an embodiment.
Figure 8:
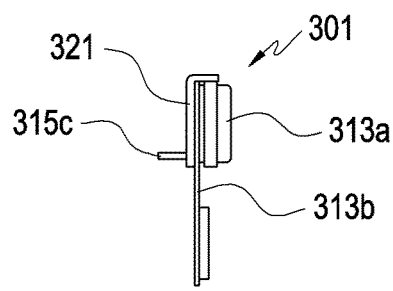
FIG. 8 illustrates a side view of a key assembly of an electronic device according to an embodiment.

FIG. 5 illustrates a key assembly of an electronic device according to an embodiment. FIG. 6 illustrates a front view of a key assembly of an electronic device according to an embodiment. FIG. 7 illustrates a rear view illustrating a key assembly of an electronic device according to an embodiment. FIG. 8 illustrates a side view of a key assembly of an electronic device according to an embodiment.

Referring to FIGS. 4 to 8, the key assembly 301 (e.g., the first key assembly 201a or the second key assembly 202a of FIG. 3) includes a sealing member 301a, a flexible printed circuit board 301b, a switch member 315, and a reinforcing member 301c. The sealing member 301 may be an elastic member, and may be made of an elastic material such as rubber, silicone, or urethane. The sealing member 301a includes a first body portion 311a in the form of a flat plate, which substantially faces the inner surface of the housing, and a protrusion 313a that protrudes from one surface of the first body portion 311a. The protrusion 313a may be brought into close contact with a side wall of the housing, e.g., an inner surface of a side bezel structure. An area where the protrusion 313a contacts the inner surface of the side bezel structure may include an area where at least a through-hole is formed. For example, the protrusion 313a may contact the inner surface of the side bezel structure along a closed curve trajectory surrounding the area where the through-hole is formed.

The sealing member 301a includes a fixing portion 319a extending from at least one end of the first body portion 311a. When the sealing member 301a is viewed from the front side, the fixing portion 319a may have a shape protruding in the longitudinal direction (e.g., Y direction in FIG. 3) from one side (e.g., lower portion) of the both ends of the first body portion 311a. When the sealing member 301a is viewed from the top or the side, the fixing portion 319a may have a flat plate shape together with the first body portion 311a.

The flexible printed circuit board 301b includes a mounting portion 311b disposed to face one surface of the sealing member 301a, e.g., an inner surface of the sealing member 301a, and a connection portion 313b extending from one side of the mounting portion 311b. The mounting portion 311b may be replaced with a rigid printed circuit board, and the connection portion 313b may be made of a flexible material. The connection portion 313b may electrically connect the key assembly 301 (e.g., the mounting unit 311b) to a circuit board. The switch member 315 may be disposed on the mounting portion 311b to be electrically connected to the printed circuit board through a wiring or a printed circuit pattern formed on the mounting portion 311b or the connection portion 313b. The switch member 315 may include a dome key structure or a tact switch structure, and the flexible printed circuit board 301b or the mounting portion 311b may form a circuit structure together with the switch member 315.

The flexible printed circuit board 301b further includes a first extended piece 319b extending from both ends of the mounting portion 311b, and the first extended piece 319b may be disposed to face the fixing portion 319a.

The reinforcing member 301c may be coupled to the sealing member 301a with the flexible printed circuit board 301b interposed therebetween. For example, the reinforcing member 301c may be bonded to the flexible printed circuit board 301b. The reinforcing member 301c may be provided as a structure (e.g., a spacer member) that secures or maintains a gap between the fixing member 302 and a circuit structure, e.g., the flexible printed circuit board 301b. For example, the reinforcing member 301c may include a protrusion structure in the form of a leaf spring or a curved surface that is partially cut and protrudes toward the fixing member 302. Alternatively, the reinforcing member 301c may be provided as a structure for holding at least a portion of the sealing member 301a or the flexible printed circuit board 301b in the form of a flat plate.

The reinforcing member 301c may include a second body portion 311c having a flat plate shape corresponding to the sealing member 301a or the flexible printed circuit board 301b, and a second extended piece 319c that extends from at least one end of the second body portion 311c. When the reinforcing member 301c is viewed from the front side, the second extended piece 319c may have a shape that protrudes in the longitudinal direction (e.g., Y direction in FIG. 3) from one side (e.g., lower portion) of both ends of the second body portion 311c. When the reinforcing member 301c is viewed from the top or the side, the second extended piece 319c may substantially have a flat plate shape together with the second body portion 311c.

The reinforcing member 301c may be made of a rigid material, e.g., a metal such as stainless steel, and may have a larger area than the sealing member 301a or the flexible printed circuit board 301b. The sealing member 301a, the flexible printed circuit board 301b, or the reinforcing member 301c may have a generally flat plate shape and may be coupled to face each other, thereby forming the key assembly 301. When the key assembly 301 is completed, the reinforcing member 301c made of the rigid material may function as a structure that supports or at least partially protects the sealing member 301a or the flexible printed circuit board 301b.

The reinforcing member 301c may further include a protecting piece 313c or a fixing piece 315c. The protecting piece 313c may have a shape that is bent forward from the upper side of the reinforcing member 301c (e.g., the second body portion 311c) when viewed from the side of the reinforcing member 301c. For example, the protecting piece 313c may have a shape that extends or is bent from an upper edge of the reinforcing member 301c at a position adjacent to both ends of the reinforcing member 301c. When the reinforcing member 301c is coupled to the sealing member 301a or the flexible printed circuit board 301b, the protecting piece 313c may be disposed to partially surround the upper edge of the sealing member 301a or the flexible printed circuit board 301b. The fixing piece 315c may have a shape that is bent backward from the lower side of the reinforcing member 301c when the reinforcing member 301c is viewed from the side. For example, the fixing piece 315c may be disposed to extend or protrude from the rear surface of the key assembly 301, and may be positioned to correspond to the connection portion 313b of the flexible printed circuit board 301b. When the key assembly 301 is assembled to a housing, the fixing piece 315c may maintain a portion of the connection portion 313b to be positioned in a predetermined area or space inside the housing.

A surface of the flexible printed circuit board 301b may be bonded to the sealing member 301a, and another surface of the flexible printed circuit board 301b may be bonded to the reinforcing member 301c. In this bonding structure, a double sided tape or a pressure sensitive adhesive may be utilized. The reinforcing member 301c may be bonded to the flexible printed circuit board 301b by a surface mounting process or welding according to the material or size of the reinforcing member 301c. Alternatively, the sealing member 301a and the reinforcing member 301c may be directly bonded to each other, and in the flexible printed circuit board 301b, at least the mounting portion 311b may be received between the sealing member 301a and the reinforcing members 301c. For example, the sealing member 301a may be bonded to the front surface of the reinforcing member 301c while surrounding the front surface or the edge of the mounting portion 311b.

The sealing member 301a, the flexible printed circuit board 301b, or the reinforcing member 301c may be coupled to the side bezel structure 210 or the first support member 211 at a side of the rear surface of the electronic device. In this case, the "upper edge" of the reinforcing member 301c, the flexible printed circuit board 301b, or the sealing member 301a refers to a portion positioned at a side of the second surface 110B of the electronic device 200 or the rear surface thereof while the reinforcing member 301c, the flexible printed circuit board 301b, or the sealing member 301a is assembled to the side bezel structure 210 or the first support member 211. The reinforcing member 301c may be coupled to a side bezel structure or a first support member at a side of the front surface of the electronic device. In this case, the "upper edge" of the reinforcing member 301c, the flexible printed circuit board 301b, or the sealing member 301a may refer to a portion positioned at a side of the first surface of the electronic device or the front surface thereof while the reinforcing member 301c, the flexible printed circuit board 301b, or the sealing member 301a is assembled to the side bezel structure or the first support member. Although the expression "upper edge" is used, the specific position of the "upper edge" may vary depending on the embodiments (e.g., an assembly direction) or the alignment direction of the component(s). The term "upper edge" may refer to an edge of the reinforcing member 301c which is exposed to the outside of an assembling hole or is positioned toward the outside of the assembling hole while the reinforcing member 301c is assembled to the side bezel structure or the first support member.

As will be described below, the connection portion 313b may be disposed at least partially parallel to the front surface of the electronic device, and the fixing piece 315c may be disposed to surround or cover a portion of the connection portion 313b inside the housing. The protecting piece 313c may be positioned to surround a portion of the edge of at least the flexible printed circuit board 301b or the sealing member 301a at both ends thereof in the longitudinal direction while being exposed to the outside of the assembling hole.

Figure 9:
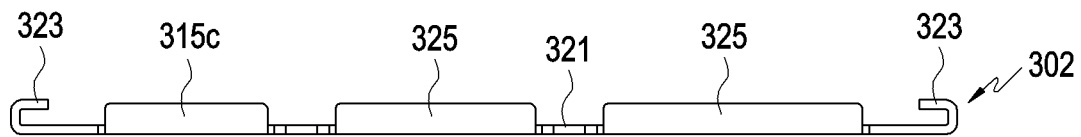
FIG. 9 illustrates a fixing member of an electronic device according to an embodiment.
Figure 10:
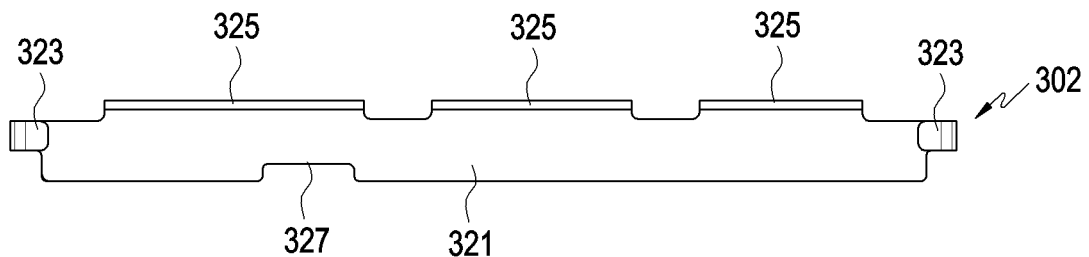
FIG. 10 illustrates a front view of a fixing member of an electronic device according to an embodiment.
Figure 11:
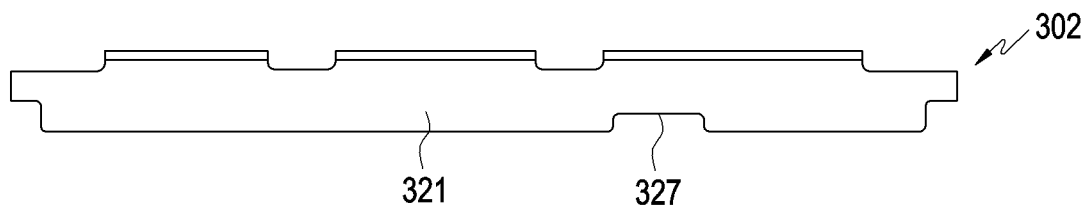
FIG. 11 illustrates a rear view of a fixing member of an electronic device according to an embodiment.
Figure 12:
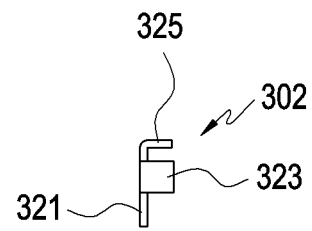
FIG. 12 illustrates a side view of a fixing member of an electronic device according to an embodiment.

FIG. 9 illustrates a fixing member of an electronic device according to an embodiment. FIG. 10 illustrates a front view of a fixing member of an electronic device according to an embodiment. FIG. 11 illustrates a rear view of a fixing member of an electronic device according to an embodiment. FIG. 12 illustrates a side view of a fixing member of an electronic device according to an embodiment.

Referring to FIGS. 4 and 9 to 12, the fixing member 302 may be a metal member made of a rigid material, e.g., stainless steel, and includes a fixing plate 321, a first bent portion 323, a second bent portion 325, and an avoidance groove 327. The fixing plate 321 may be a flat plate having a shape corresponding to the second body portion 311c of at least the reinforcing member 301c and may be positioned to face the rear surface of the key assembly 301. The avoidance groove 327 may be formed at one edge of the fixing member 302, e.g., at an edge of the lower portion of the fixing plate 321. When the fixing member 302 is coupled to the key assembly 301, the avoidance groove 327 may receive the fixing piece 315c.

The first bent portion 323 may extend from at least one end of the fixing member 302, e.g., at both ends of the fixing plate 321. When viewed outside of a front plate or a rear plate, the first bend portion 323 may be bent to form a substantially "U" shape and may be disposed to face the other portion of the fixing member 302. The "U" shaped structure may be formed such that two portions facing each other are inclined with respect to each other. Even if the two portions facing each other are formed to be inclined with respect to each other, the two portions facing each other in the "U" shaped structure may be aligned in parallel when a fixing member 302 is received in an assembling hole. The fixing member 302 may include the first bent portion 323, and thereby may be disposed to surround a portion of the key assembly 301. The fixing member 302 may include the first bent portion 323, and thereby may be disposed behind the key assembly 301 and may be partially positioned in front of the key assembly 301.

The second bent portion 325 may be a portion that extends or is bent from the upper side of the fixing member 302, e.g., the upper side of the fixing plate 321, and may be positioned to surround a portion of the edge of the key assembly 301. A plurality of the second bent portions 325 may be arranged along the longitudinal direction of the fixing member 302. The number and size or position of the second bent portions 325 may be selected in consideration of the processability of the fixing member 302 while providing a structure surrounding the key assembly 301.

Figure 13:
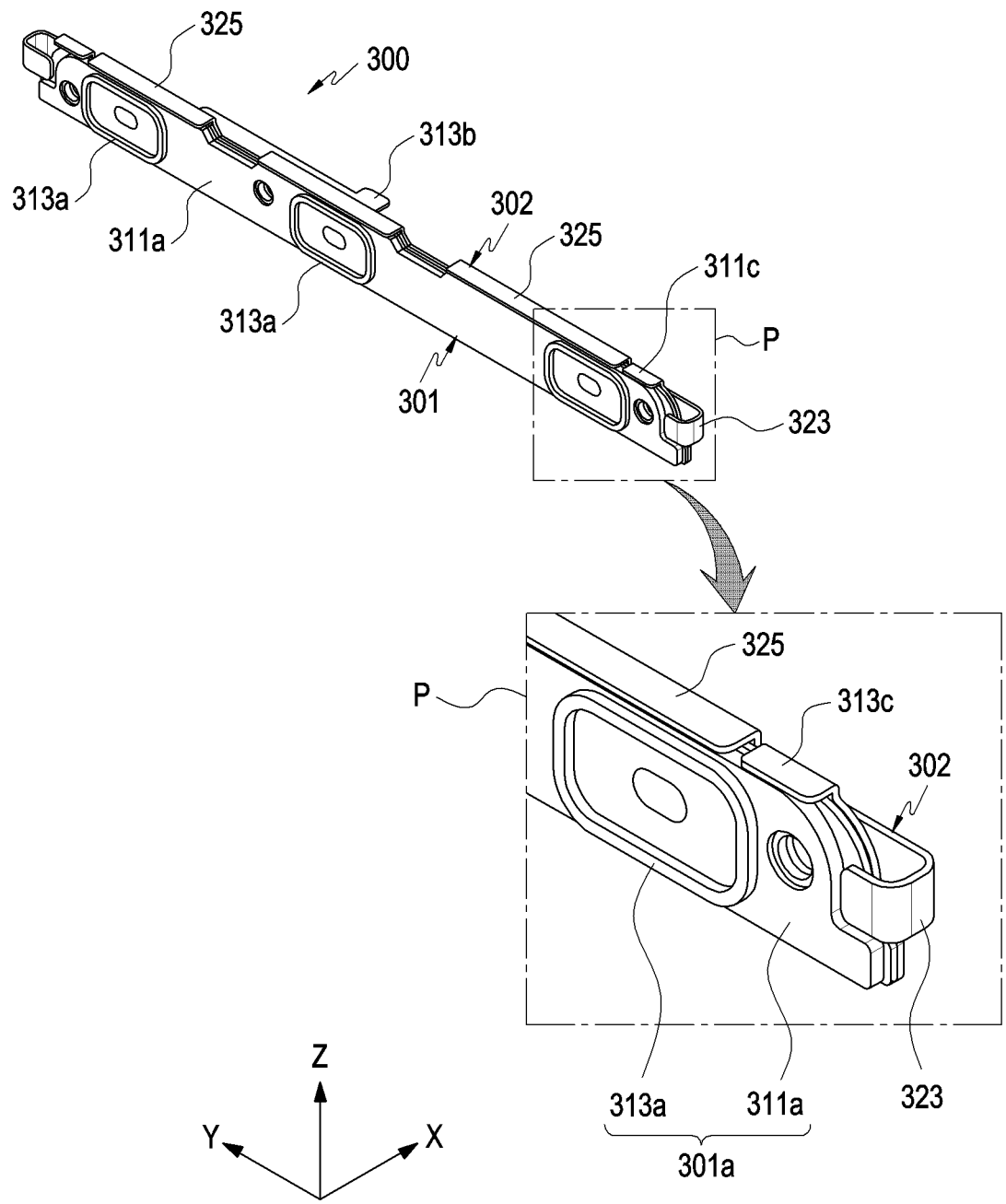
FIG. 13 illustrates a combination of a key assembly and a fixing member of an electronic device according to an embodiment.
Figure 14:
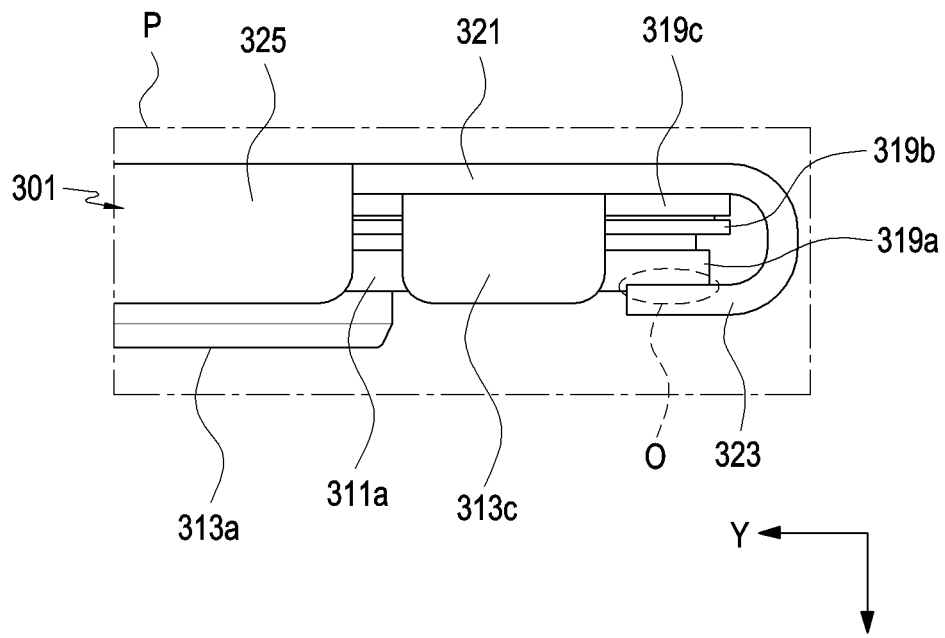
FIG. 14 illustrates an enlarged plan view pf a portion P of FIG. 13.
Figure 15:
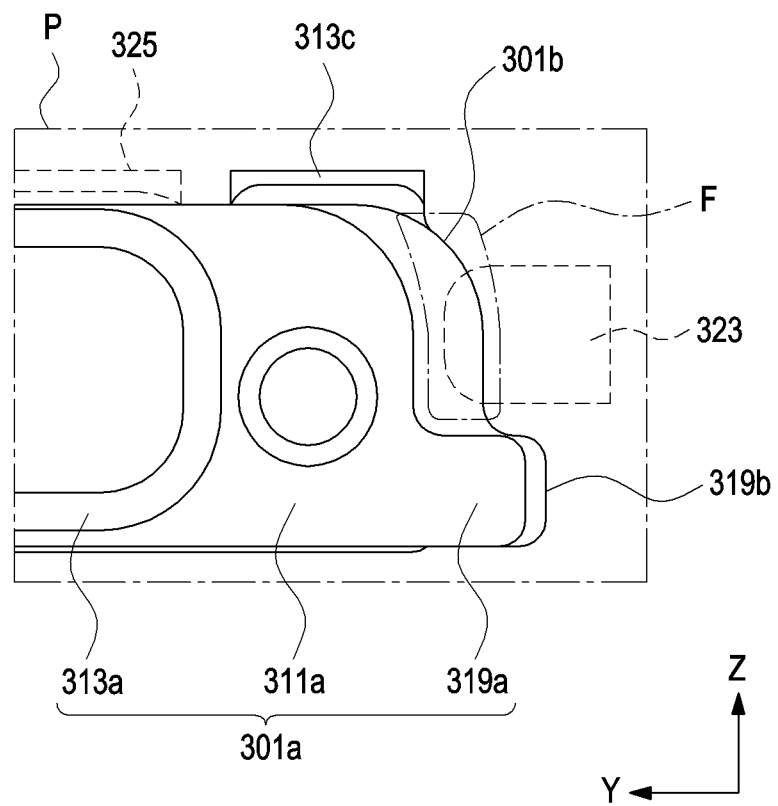
FIG. 15 illustrates an enlarged front view of a portion P of FIG. 13.

FIG. 13 illustrates a combination of a key assembly and a fixing member of an electronic device according to an embodiment. FIG. 14 illustrates an enlarged plan view of a portion P of FIG. 13. FIG. 15 illustrates an enlarged front view of a portion P of FIG. 13.

FIGS. 13 to 15 illustrate a key assembly 301 and a fixing member 302 assembled to a housing (of the electronic device. Hereinafter, this state will be referred to as a "coupled state 300".

Referring to FIGS. 13 to 15, in the coupled state 300, the sealing member 301a, e.g., the protrusion 313a, may be positioned to face forward and the fixing member 302 may be positioned to face backward, and the flexible printed circuit board 301b or the reinforcing member 301c may be disposed between the sealing member 301a and the fixing member. To hold the key assembly 301 and the fixing member 302 in a coupled state, a fastening member such as an adhesive or a screw may or may not be used. For example, the key assembly 301 and the fastening member 302 may be coupled in such a manner to be forcibly fitted between structures formed in a housing. The reinforcing member 301c or the fixing member 302 may further include a leaf spring structure or a protruding structure, thereby securing a gap between the flexible printed circuit board 301b and the fixing member 302.

A portion of the flexible printed circuit board 301b or the reinforcing member 301c may be disposed to face the sealing member 301a and the other potion F thereof may be exposed to the front of the key assembly 301. For example, when the key assembly 301 is assembled to the housing, the other portion F of the flexible printed circuit board 301b or the reinforcing member 301c may be disposed to directly face the inner surface of the housing. The protecting piece 313c may be positioned to partially surround the edge of the sealing member 301a or the flexible printed circuit board 301b at both ends of the key assembly 301 in the longitudinal direction (e.g., Y direction of FIG. 3) of the key assembly 301.

In the coupled state 300, the first bent portion 323 may be at least partially positioned forward of the key assembly 301 while the fixing member 302 is generally positioned behind the key assembly 301.

As illustrated in FIG. 14, when viewed in a plan view in the coupled state 300, the first bent portion 323 may be positioned to partially overlap the fixing portion 319a. For example, a portion of the first bent portion 323 indicated by the reference numeral "O" in the width direction (e.g., X direction of FIG. 3) of the electronic device may overlap the fixing portion 319a. When viewed from the front, the first bent portion 323 may be arranged side by side without overlapping the fixing portion 319a in the thickness direction (e.g., Z direction of FIG. 3). For example, in the coupled state 300, if the fixing member 302 is fixed, the movement of the key assembly 301 in the thickness direction may be limited by the first bent portion 323 and the fixing portion 319a.

In the coupled state 300, the second bent portion 325 may be positioned to surround a portion of the edge of the key assembly 301. For example, in the thickness direction, the first bent portion 323 may be positioned higher than the fixing portion 319a, and the second bent portion 325 may be positioned higher than the key assembly 301 while surrounding a portion of the edge of the key assembly 301. For example, the fixing portion 319a (or the first extended piece 319b or the second extended piece 319c) may be positioned between the bottom surface of the assembling hole 415 and the first bent portion 323, and may be restricted by the first bent portion 323 in order to limit the movement of the fixing portion 319a in the Z direction. The key assembly 301 may be positioned between the bottom surface of the assembling hole 415 and the second bent portion 325 and may be restricted by the second bent portion 325 in order to limit the movement of the key assembly 301 in the Z direction.

As mentioned above, in the coupled state 300, if the fixing member 302 is fixed by the first bent portion 323 and the fixing portion 319a, or the second bent portion 325, the key assembly 301 may be restricted from moving upwards more than the fixing member 302 in the thickness direction.

The second bent portion 325 may be positioned between the protecting pieces 313c. For example, the protecting pieces 313c may protect the edges of at least the sealing member 301a and the flexible printed circuit board 301b at both ends in the longitudinal direction, and the second bent portion 325 may protect the edges of the sealing member 301a and the flexible printed circuit board 301b between the protecting pieces 313c.

Figure 16:
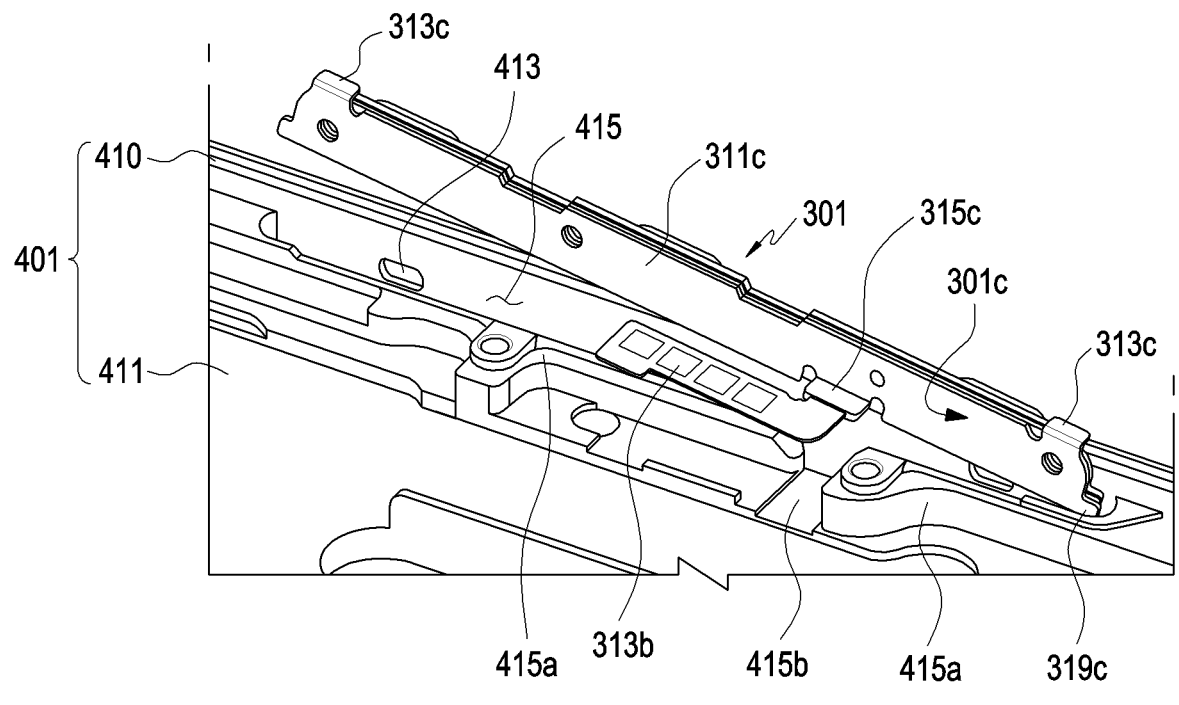
FIG. 16 illustrates a key assembly in a housing of an electronic device according to an embodiment.
Figure 16:
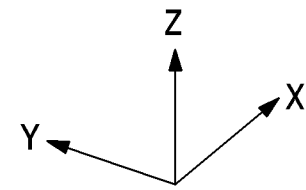

FIG. 16 illustrates a key assembly in a housing of an electronic device according to an embodiment.

Referring to FIG. 16, a housing includes a side bezel structure 410 and a first support member 411. The housing 401 includes a through-hole 413 formed through a sidewall, e.g., the side bezel structure 410, and an assembling hole 415 formed adjacent to the through-hole 413 on the inner side of the side bezel structure 410. The through-hole 413 may extend from the outer surface of the side bezel structure 410 to the inner surface thereof in a penetrating manner. When a plurality of switch members 315 are provided, one through-hole 413 having an elongated hole shape corresponding to an area in which the plurality of switch members 315 are arranged may be formed. The assembling hole 415 may include a portion of the side bezel structure 410 (e.g., a portion of the inner surface) as an inner wall. When viewed from above a front plate or a rear plate, the assembling hole 415 may be formed in an elongated recess shape. When a plurality of switch members 315 are provided, a plurality of through-holes 413 corresponding to the number of the switch members 315 may be formed. The key assembly 301 may be assembled to the assembling hole 415 to be positioned to face an inner surface of the housing 401 (e.g., an inner surface of the side bezel structure 410). When the fixing member 302 is assembled, the fixing member 302 may be brought into close contact with the inner surface of the side bezel structure 410.

The first support member 411 may be integrally formed with the side bezel structure 401, and may include at least one structure 415a protruding from one surface thereof. The at least one structure 415a may protrude from a surface of the first support member 411 and may be positioned to at least partially face the inner surface of the side bezel structure 410. In addition, the at least one structure 415a may be connected to the side bezel structure 410 at both ends in the longitudinal direction (e.g., Y direction of FIG. 3).

The at least one structure 415a may form the assembling hole 415 together with the side bezel structure 410. For example, the assembling hole 415 may refer to a space defined by a portion of the side bezel structure 410, a portion of the first support member 411, or a portion of the at least one structure 415a. A portion of the surface of the at least one structure 415a may be disposed to face the inner surface of the side bezel structure 410, thereby forming an inner wall of the assembling hole 415. Alternatively, a portion of the first support member 411 defining the assembling hole 415 may substantially form a bottom surface of the assembling hole 415.

Depending on the position where the assembling hole 415 is formed, the bottom surface of the assembling hole 415 may be formed to face toward a front plate or a rear plate. When viewed from above the front plate or the rear plate, the assembling hole 415 may have an elongated recess shape extending in the longitudinal direction (e.g., Y direction of FIG. 3). Here, the "view from above" may refer to the assembling hole 415 projecting from the front plate 102, the rear plate 111, or the structures disposed on the inner side of the front plate 102 or the rear plate 111, without being exposed to the outside of the front plate 102 or the rear plate 111.

The electronic device, e.g., the housing 401, may include a fixing groove 415b formed therein. The fixing groove 415b may be formed between the at least one structure 415a by removing a portion of the at least one structure 415a. The at least one structure 415a may include some discontinuous sections (e.g., a position or a section in which the fixing groove 415b is formed) around the assembling hole 415, and the discontinuous sections may be provided as the fixing groove 415b. The fixing groove 415b may provide a space adjacent to or substantially connected to the assembling hole 415.

The key assembly 301 may be coupled to the assembling hole 415 before the fixing member 302. Since the assembling hole 415 has a thickness (e.g., a length measured along the X direction of FIG. 3) to receive the key assembly 301 and the fixing member 302, it is possible to reduce or prevent friction with other structures in a process of assembling the key assembly 301 to the assembling hole 415. The key assembly 301 may enter the assembling hole 415 in a method of supporting and rotating one end of the reinforcing member 301c, e.g., the second extended piece 319c of one side on the inner wall of one end of the assembling hole 415. For example, at least one of the second extended pieces 319c may provide a guide function for assembling the key assembly 301 to the assembling hole 415. The second extended piece 319c may extend further than an edge of the fixing portion 319a or the first extended piece 319b. In supporting the inner wall of one end of the assembling hole 415, the sealing member 301a or the flexible printed circuit board 301b may not interfere with other structures. Before or while the key assembly 301 enters the assembling hole 415, the connection portion 313b may be bent in a direction in which a portion of the connection portion 313b approaches the fixing piece 315c. As the key assembly 301 enters the assembling hole 415, the connection portion 313b or the fixing piece 315c may be gradually received into the fixing groove 415b.

Figure 17:
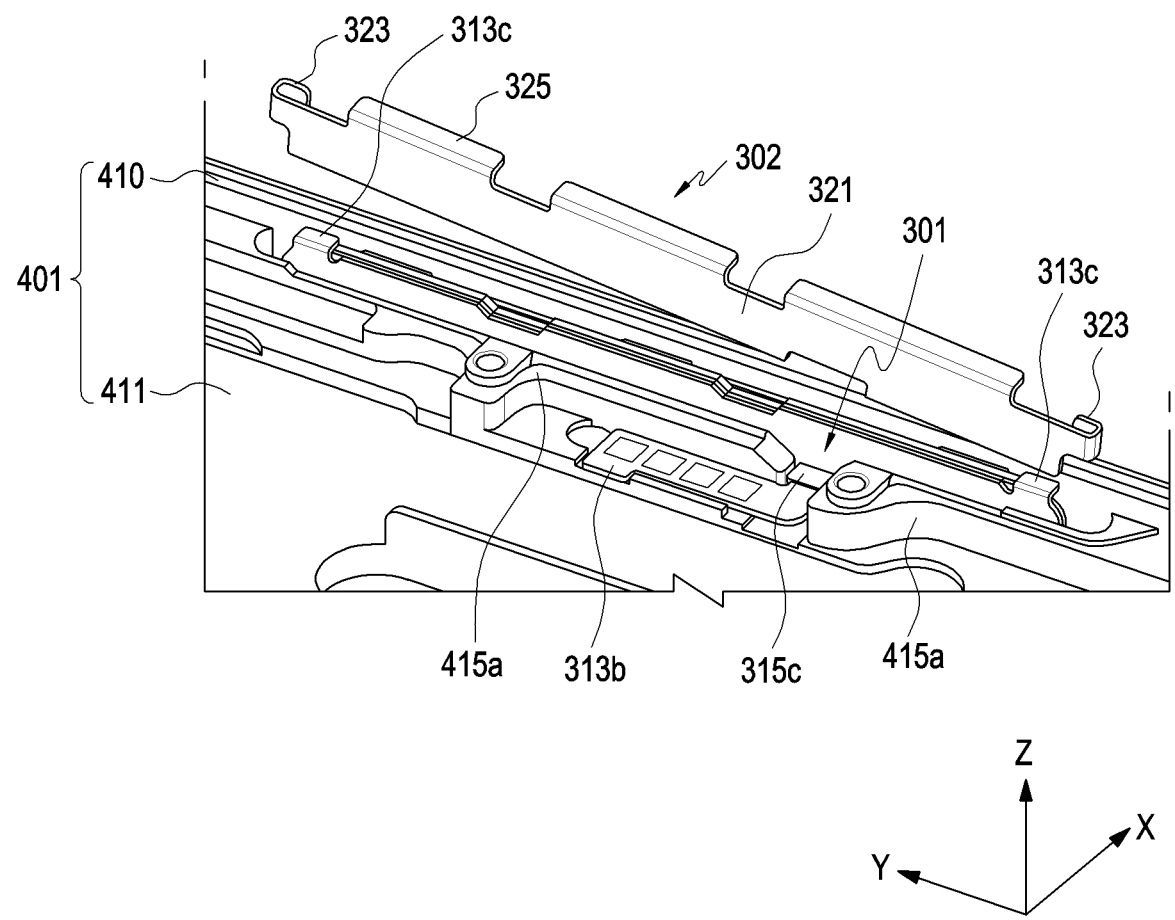
FIG. 17 illustrates a fixing member in a housing of an electronic device according to an embodiment.

FIG. 17 illustrates a fixing member in a housing of an electronic device according to an embodiment.

Referring to FIG. 17, when the key assembly 301 is assembled to the assembling hole 415, the fixing piece 315c may be fixed in the fixing groove 415b. The fixing groove 415b may limit the movement of the fixing piece 315c in the longitudinal direction (e.g., the Y direction). The fixing groove 415b and the fixing piece 315c may restrict the movement of the key assembly 301 in the Y direction. The flexible printed circuit board 301b, e.g., the connection portion 313b, may be disposed between the bottom surface (e.g., a portion of one surface of the first support member 411) of the fixing groove 415b and the fixing piece 415. The connection portion 313b may be disposed in the fixing groove 415b while a portion of the connection portion 313b is wrapped by the fixing piece 415. A seating groove for receiving the connection portion 313b may be formed on one surface of the first support member 411.

When the key assembly 301 is assembled to the assembling hole 415, the protrusion 313a may be disposed to face the inner surface of the housing 401, e.g., the inner surface of the side bezel structure 410. When the key assembly 301 is assembled to the assembling hole 415, the protrusion 313a of the key assembly 301 or a switch member 315 may be aligned with the through-hole 413.

The protrusion 313a may be brought into close contact with the inner surface of the side bezel structure 410 along a closed curve trajectory around an area where the through-hole 413 is formed. For example, the sealing member 301c or the protrusion 313a may form a waterproof structure between the through-hole 413 and an inner space of the side bezel structure 410.

When the key assembly 301 is assembled to the assembling hole 415, the fixing member 302 may be assembled to the assembling hole 415. One end of the fixing member 302, e.g., an end where the first bent portion 323 is formed may be rotated while entering the assembling ball 415 first, so that the fixing member 302 may be assembled to the assembling hole 415. When one end of the fixing member 302 interferes with the key assembly 301 while assembling one end of the fixing member 302 to the assembling hole 415, the sealing member 301a or the flexible printed circuit board 301b may be damaged. The protecting piece 313c may be disposed to surround the flexible printed circuit board 301b or the sealing member 301a on the upper side of the key assembly 301. For example, the protecting piece 313c may prevent the flexible printed circuit board 301b or the sealing member 301a from being damaged during the assembly of the fixing member 302.

When the fixing member 302 is assembled to the assembling hole 415, the fixing plate 321 and the first bent portion 323 may be respectively supported on the inner wall of the assembling hole 415 to fix the fixing member 302 within the assembling hole 415. An inner wall of the assembling hole 415 on which the fixing plate 321 is supported may be an outer surface of the structure 415a. The inner wall of the assembling hole 415 on which the first bent portion 323 is supported may be a portion of the inner surface of the side bezel structure 410.

The fixing member 302, for example, the fixing plate 321, may bring the key assembly 301 into close contact with the inner wall of the housing 401 (e.g., the inner wall of the side bezel structure 410), and may restrict the movement of the key assembly 301 in the width direction (e.g., X direction) of an electronic device. The fixing member 302 may further include a leaf spring structure or a protrusion structure protruding from one surface thereof, so that the key assembly 301 may be brought into close contact with the inner wall of the housing 401. Waterproof performance may be enhanced by using the shape of the fixing member 302. The first bent portion 323 may restrict the fixing member 319a inside the assembling hole 415, and the second bent portion 325 may restrict the reinforcing member 301c, the flexible printed circuit board 301b, or the sealing member 301a inside the assembling hole 415 while protecting the reinforcing member 301c, the flexible printed circuit board 301b, or the sealing member 301a. For example, when the key assembly 301 is assembled to the assembling hole 415, the fixing member 302 may be fixed to the assembling hole 415 and the key assembly 301 may be restricted from moving in the assembling hole 415 in the X direction or the Z direction by the fixing member 302. In the Y direction, a configuration in which the key assembly 301 is restricted from moving by the fixing piece 315c and the fixing groove 415b has been described above.

Figure 18:
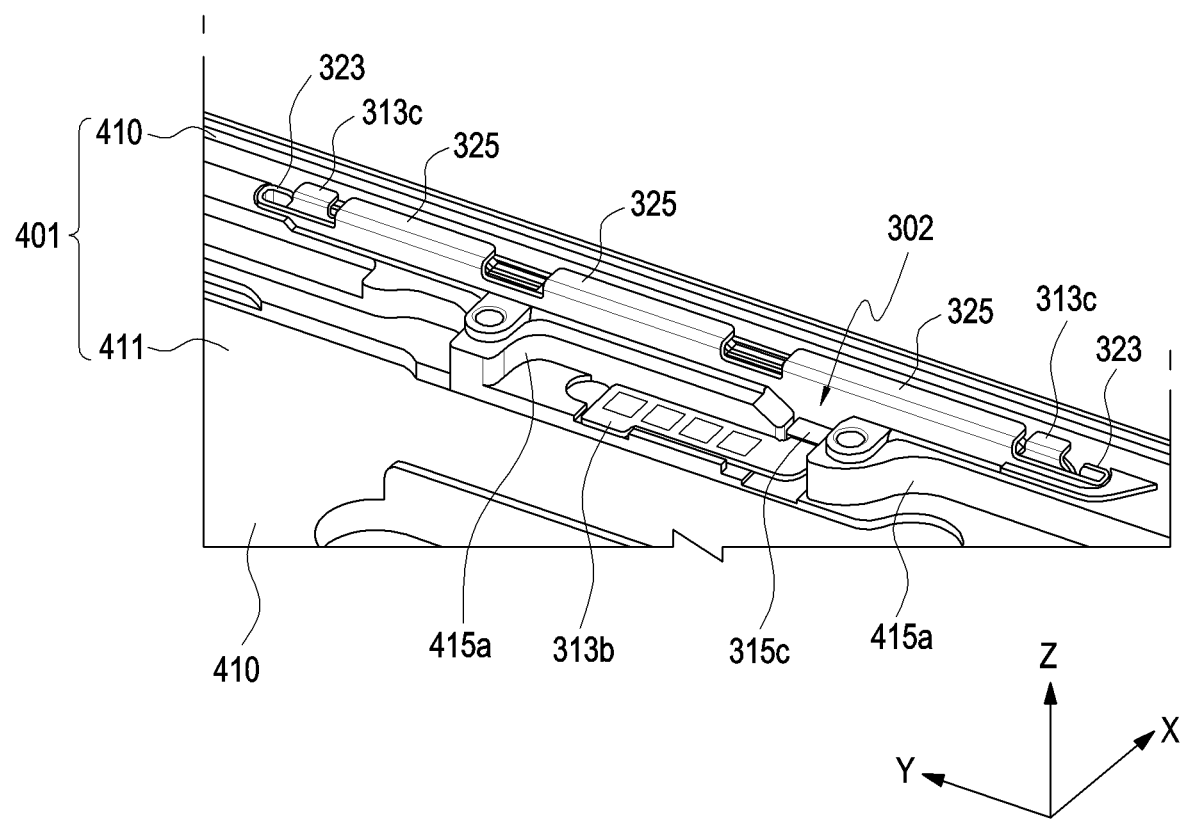
FIG. 18 illustrates a key assembly and a fixing member in a housing of an electronic device according to an embodiment.
Figure 19:
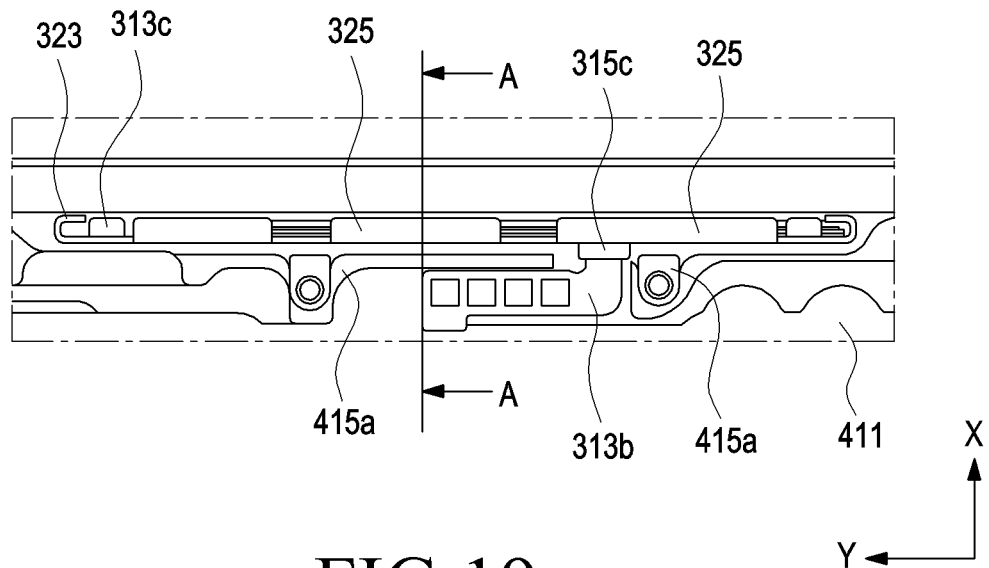
FIG. 19 illustrates a key assembly and a fixing member in a housing of an electronic device according to an embodiment.
Figure 20:
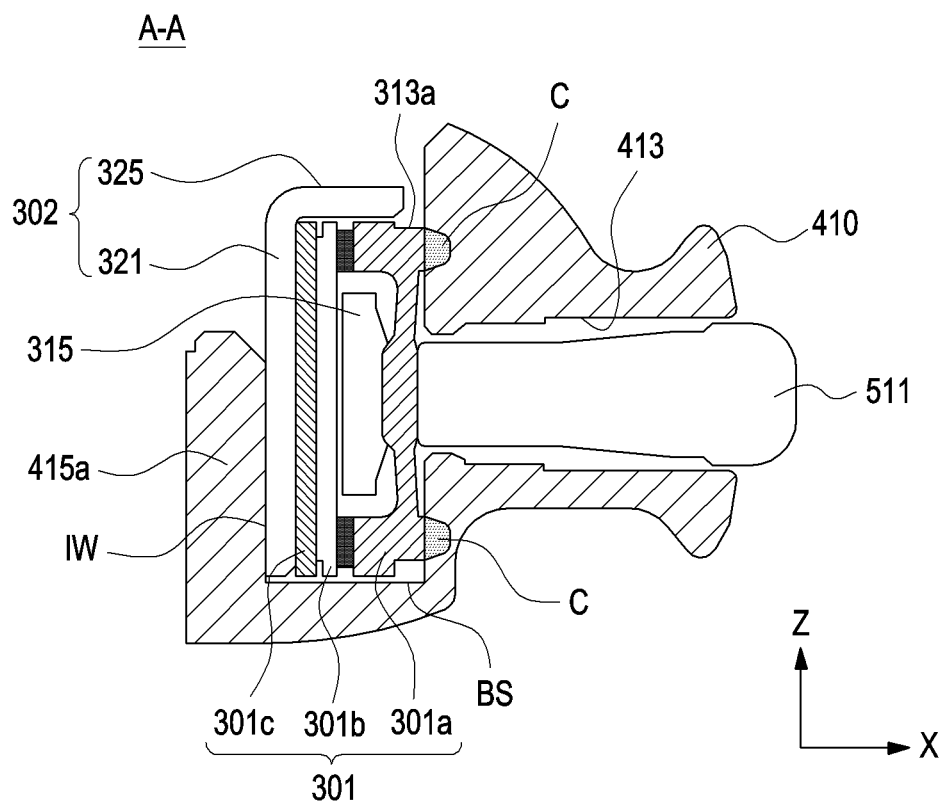
FIG. 20 illustrates a cross-sectional view of a portion of an electronic device cut along line A-A of FIG. 19.

FIG. 18 illustrates a key assembly and a fixing member in a housing of an electronic device according to an embodiment;

FIG. 19 illustrates a key assembly and a fixing member in a housing of an electronic device according to an embodiment; and FIG. 20 illustrates a cross-sectional view of a portion of an electronic device cut along line A-A of FIG. 19

FIG. 18 illustrates a key assembly and a fixing member in a housing of an electronic device according to an embodiment. FIG. 19 illustrates a key assembly and a fixing member in a housing of an electronic device according to an embodiment. FIG. illustrates a cross-sectional view of a portion of an electronic device cut along line A-A of FIG. 19.

Referring to FIGS. 18 to 20, the fixing plate 321 and the first bent portion 323 may be supported on an inner wall (IW) of the assembling hole 415 or the inner surface of the side bezel structure 410, and thereby the fixing member 302 may be fixed to the assembling hole 415. The first bent portion 323 may accumulate an elastic force while the first bent portion 323 is supported on the inner surface of the side bezel structure 410. The elastic force accumulated in the first bent portion 323 may act as a fixing force for more firmly fixing the fixing member 302. For example, the elastic force accumulated in the first bent portion 323 or a repulsive force caused by the elastic force may bring the first bent portion 323 into close contact with the inner surface of the side bezel structure 410 and may bring the fixing plate 321 into close contact with the inner wall of the assembling hole 415. The elastic force accumulated in the first bent portion 323 may increase a static friction force between the first bent portion 323 and the inner surface of the side bezel structure 410 or between the fixing member 321 and the inner wall of the assembling hole 415, and this static friction force may act as a force for fixing the fixing member 302 to the assembling hole 415.

When the key assembly 301 is assembled to the assembling hole 415, the protrusion 313a or the switch member 315 may be aligned with the through-hole 413. A key input device may include a button structure received in the through-hole 413 and aligned with the key assembly 301. For example, the through-hole 413 may receive a button member 511 in order to linearly reciprocate, and a user may press the button member 511 to operate the switch member 315. The sealing member 301a, e.g., the protrusion 313a (or a partial region of the sealing member 301a surrounded by the protrusion 313a), may be made of an elastic material, and the button member 511 may be maintained in a protruding state on the outer surface of the side bezel structure 410 when no external force is applied. For example, if there is no force for pressing the button member 511, the protrusion 313a may provide an elastic force for returning the button member 511 to an initial position.

Before the fixing member 302 is assembled to the assembling hole 415, a space equal to the thickness of the fixing member 302 (e.g., the thickness of the fixing plate 321 measured along the X direction) may be secured, and the key assembly 301 can be easily assembled to the assembling hole 415 or can be easily separated from the assembling hole 415. When the fixing member 302 is assembled while the key assembly 301 is assembled to the assembling hole 415, the fixing member 302 may bring the key assembly 301 into close contact with the inner surface of the side bezel structure 410 by the thickness of the fixing plate 321. For example, as the fixing member 302 is assembled, the protrusion 313a may be brought into close contact with the inner surface of the side bezel structure 410 around the through-hole 413. As the fixing member 302 is assembled, the key assembly 301 may be restricted from moving in the X direction. Alternatively, the reinforcing member 301c or the fixing member 302 may include a leaf spring structure or a protruding structure protruding from one surface, so that the key assembly 301 may be more stably restricted from moving in the X direction.

Referring to FIG. 20, a portion indicated by reference numeral "C" represents a portion of the protrusion 313a and overlaps the side bezel structure 410, but it is noted that the portion indicated by reference numeral "C" represents a degree to which the sealing member 301a or the protrusion 313a is compressed. When the fixing member 302 is assembled, an area where the sealing member 301a or the protrusion 313a contacts the side bezel structure 410 may increase while the sealing member 301a or the protrusion 313*a* is compressed by the portion indicated by the reference numeral "C". For example, as the area where the protrusion 313*a* contacts the side bezel structure 410 increases, waterproof performance by the sealing member 301*a* may be improved.

The fixing piece 315*c* may protrude to the rear of the fixing member 302 through an avoidance groove of the fixing member 302. The fixing piece 315*c* may be received in the fixing groove 415*b* to restrict the movement of the key assembly 301 in the longitudinal direction (e.g., the Y direction). A portion of the connection portion 313*b* may be disposed between the fixing piece 315*c* and the bottom of the fixing groove 415*b*.

The key assembly 301 may be restricted inside the assembling hole 415 by the first bent portion 323 or the second bent portion 325. In FIGS. 14 and 15, the portion F of the flexible printed circuit board 301*b* or the reinforcing member 301*c* is positioned to directly face the inner surface of the housing, e.g., the inner surface of the side bezel structure 410. For example, a space corresponding to the thickness of the sealing member 301*a* (e.g., the thickness measured along the X direction) may be formed between the portion F of the flexible printed circuit board 301*b* or the reinforcing member 301*c* and the inner surface of the side bezel structure 410.

The first bent portion 323 may be disposed between the portion F of the flexible printed circuit board 301*b* or the reinforcing member 301*c* and the inner surface of the side bezel structure 410. The first bent portion 323 may partially overlap the fixing portion 319*a* of the sealing member 301*a* in the X direction (e.g., a portion indicated by reference numeral "0" in FIG. 14) and may be disposed in parallel with the fixing portion 319*a* at one side of the fixing portion 319*a* in the Z direction. The first bent portion 323 may be positioned to at least partially face the inner surface of the housing (e.g., the side bezel structure 410) together with the fixing portion 319*a*, or may be supported on the inner wall of the assembling hole 415 (e.g., the inner surface of the side bezel structure 410). As a result, the first bent portion 323 may fix the fixing member 302 to the assembling hole 415 while restricting the fixing portion 319*a* inside the assembling hole 415. Here, "the first bent portion 323 restricts the fixing portion 319*a* inside the assembling hole 415" indicates that the fixing portion 319*a* or the key assembly 301 may be restricted from moving in the Z direction inside the assembling hole 415.

When the fixing member 302 is assembled to the assembling hole 415, the second bent part 325 may be located outside the assembling hole 415. The second bent portion 325 may he received at least partially into the assembling hole 415. The second bent portion 325 may be positioned to surround a portion ofthe edge of the key assembly 301, e.g., the reinforcing member 301*c*, the flexible printed circuit board 301*b*, or the sealing member 301*a*. The second bent portion 325 may he positioned to surround a portion of the key assembly 301, and thereby the key assembly 301 may be restricted within the assembling hole 415 in the Z direction.

When the key input device, e.g., the key assembly 301 or a waterproof structure is required to be repaired, an operator may first detach the fixing member 302 from the assembling hole 415. When the fixing member 302 is detached from the assembling hole 415, a space where the key assembly 301 can be handled m the assembling hole 415 may be expanded by the thickness of the fixing plate 321. For example, when the fixing member 302 is detached from the assembling hole 415, interference or friction with other structures may be alleviated or prevented in detaching the key assembly 301 from the assembling hole 415.

As described above, inside the assembly hole 415, the key assembly 301 may be restricted in the Y direction by the configuration of the fixing piece 315*c* and the fixing groove 415*b*, may be restricted in the X direction by the fixing plate 321, and may be restricted in the Z direction by the first bent portion 323 or the second bent portion 325. Since the fixing member 302 is firmly fixed to the assembling hole 415 by the elastic force accumulated in the first bent portion 323, the key assembly 301 may maintain a stable fixed state inside the assembling hole 415. The protrusion 313*a* may be brought into close contact with the inner surface of the housing 401 or the side bezel structure 410 along the trajectory surrounding an area where the through-hole 413 is formed, thereby forming a waterproof structure on the through-hole 413. The fixing plate 321 may bring the key assembly 301, e.g., the protrusion 313*a*, into close contact with the inner surface of the housing 401 or the side bezel structure 410, thereby maintaining a stable waterproof structure.

According to an embodiment, an electronic device includes a housing including a first surface facing a first direction, a second surface facing a second direction opposite the first direction, and a sidewall at least partially surrounding a space between the first surface and the second surface; at least one through-hole configured to penetrate the sidewall; an assembling hole configured to be formed adjacent to the through-hole inside the housing; a key assembly configured to be received in the assembling hole and to be disposed to face an inner surface of the housing in an area where at least the through-hole is positioned; and a fixing member configured to be received in the assembling hole and to bring the key assembly into close contact with the inner surface of the housing, wherein one surface of the key assembly is brought into close contact with the inner surface of the housing around at least the through-hole to seal between the through-hole and an inner space of the housing.

The key assembly includes a sealing member configured to be brought into close contact with the inner surface of the housing; a flexible printed circuit board configured to be coupled to face the sealing member; at least one switch member configured to be provided on one surface of the flexible printed circuit board and to be aligned with the through-hole while facing the sealing member; and a reinforcing member configured to be coupled to face the other surface of the flexible printed circuit board.

The key assembly further includes a protrusion configured to be formed on the sealing member, and the protrusion may be brought into close contact with the inner surface of the housing around the through-hole.

A portion of the flexible printed circuit board or the reinforcing member may be disposed to face the inner surface of the housing with the sealing member interposed therebetween, and the other portion of the flexible printed circuit board or the reinforcing member may be disposed to directly face the inner surface of the housing.

The electronic device further includes a first bent portion configured to be formed in at least one end of the fixing member, wherein in a state in which the fixing member is coupled to the assembling hole, a portion of the first bent portion may be interposed between the other portion of the flexible printed circuit board or the reinforcing member and the inner surface of the housing.

The electronic device further includes a first bent portion configured to be formed in at least one end of the fixing member; and a fixing portion configured to extend from at least one end of the sealing member, wherein, in a state in which the fixing member is coupled to the assembling hole, the first bent portion may interfere with the fixing portion, whereby the fixing member may restrict the key assembly in the assembling hole.

The first bent portion and the fixing portion may be positioned to face the inner surface of the housing while being positioned side by side on one side of each other. The first bent portion may be supported on the inner wall of the assembling hole while the first bent portion and the fixing portion are positioned side by side on one side of each other.

The reinforcing member includes a protecting piece configured to extend or to be bent from an edge of an upper portion at a position adjacent to both ends thereof, and in a state in which the fixing member is assembled to the assembling hole, the protecting piece may be disposed to surround an edge of an upper portion of the flexible printed circuit board or the sealing member.

The electronic device further includes a fixing groove configured to be formed adjacent to the assembling hole inside the housing; and a fixing piece configured to extend from a rear surface of the key assembly, wherein the fixing piece may be engaged with the fixing groove to restrict the movement of the key assembly.

The key assembly includes a flexible printed circuit board; and at least one switch member configured to be aligned with the through-hole, wherein the flexible printed circuit board may include a mounting portion in which the at least one switch member is disposed on one surface thereof and a connection portion extending from one side of the mounting portion, and at least a portion of the connection portion may be disposed between a bottom surface of the fixing groove and the fixing piece.

The fixing member further includes an avoidance groove configured to be formed at an edge of one side thereof, and in a state in which the fixing member is assembled to the assembling hole, the fixing piece may be positioned inside the avoidance groove.

The fixing member includes a fixing plate configured to be positioned to face a rear surface of the key assembly; a first bent portion configured to be bent at both ends of the fixing plate; and a second bent portion configured to be bent at an edge of an upper portion of the fixing plate, wherein the first bent portion may be supported on the inner wall of the assembling hole when the fixing member is assembled to the assembling hole, and the second bent portion may be positioned to surround a portion of an edge of the key assembly to restrict the key assembly inside the assembling hole.

The electronic device further includes a button member configured to be received in the through-hole, wherein the key assembly may include a switch member configured to be disposed to correspond to the button member.

According to an embodiment, an electronic device includes a housing configured to include a through-hole formed to penetrate a sidewall and an assembling hole formed adjacent to the through-hole on an inner side of the sidewall; a key assembly configured to be received in the assembling hole and to be disposed to face an inner surface of the housing in an area in which the through-hole is positioned, wherein the key assembly includes a sealing member configured to be brought into close contact with the inner surface of the housing, a flexible printed circuit board configured to be coupled to face the sealing member, at least one switch member configured to be provided on one surface of the flexible printed circuit board and to be aligned with the through-hole while facing the sealing member, and a reinforcing member configured to be coupled to face the other surface of the flexible printed circuit board; a fixing member configured to be received in the assembling hole, wherein the fixing member includes a fixing plate configured to be disposed between the inner wall of the assembling hole and the reinforcing member, a first bent portion configured to be bent at both ends of the fixing plate, and a second bent portion configured to be bent at an edge of an upper portion of the fixing plate, wherein, when the fixing member is assembled to the assembling hole, the fixing plate and the first bent portion are supported on the inner wall of the assembling hole and the second bent portion is positioned to surround a portion of an edge of the key assembly to restrict the key assembly inside the assembling hole, and the sealing member is brought into close contact with the inner surface of the housing around at least the through-hole to seal between the through-hole and an inner space of the housing.

According to an embodiment, an electronic device includes a housing configured to include a front plate, a rear plate facing a direction opposite a direction of the front plate, and a side bezel structure surrounding a space between the front plate and the rear plate, wherein the side bezel structure includes an outer surface, an inner surface, and at least one through-hole extending from the outer surface to the inner surface; an intermediate plate configured to extend from the inner surface of the side bezel structure between the front plate and the rear plate, wherein the intermediate plate forms an elongated recess together with the side bezel structure at a position adjacent to the through-hole when viewed from above the front plate or the rear plate, and the elongated recess includes an inner wall facing the side bezel structure and a bottom surface facing the front plate or the rear plate; a display configured to be disposed between the intermediate plate and the front plate and to be displayed to the outside through the front plate; a circuit structure configured to be received in the elongated recess and to include at least one dome key structure disposed to face the through-hole; an elastic member configured to be received in the elongated recess, to be disposed between the circuit structure and the inner surface of the side bezel structure, and to contact the inner surface of the side bezel structure to seal the through-hole; a metal member configured to be received in the elongated recess and to be disposed between an inner wall of the elongated recess and the circuit structure while contacting the inner wall of the elongated recess; a spacer member configured to be received in the elongated recess and to be disposed to contact the metal member and the circuit structure between the metal member and the circuit structure; and at least one button structure configured to be received in the through-hole.

The metal member includes stainless steel.

The spacer member includes a metal material.

The metal member includes a first end or a second end, and when viewed from above the front plate or the rear plate, at least one of the first end and the second end may have a "U" shaped structure.

At least one of the circuit structure and the spacer member may include an extended piece disposed between the "U" shaped structure and the bottom surface of the elongated recess.

According to an embodiment, an electronic device includes a through-hole configured to penetrate a sidewall; a housing configured to be formed adjacent to the through-hole on an inner side of the sidewall; a fixing portion configured to extend from both ends thereof; a key assembly configured to be received in the assembling hole and to be disposed to face an inner surface of the housing in an area in which the through-hole is positioned; a first bent portion configured to be formed at both ends thereof, respectively; and a fixing member configured to be received in the assembling hole and to bring the key assembly into close contact with the inner surface of the housing, wherein, in a state in which the fixing member is assembled to the assembling hole, the first bent portion may interfere with the fixing portion, whereby the fixing member may restrict the key assembly inside the assembling hole.

The first bent portion and the fixing portion may be positioned to face the inner surface of the housing while being positioned side by side on one side of each other.

The first bent portion may be supported on an inner wall of the assembling hole while the first bent portion and the fixing portion are positioned side by side on one side of each other.

The fixing member further includes a second bent portion configured to be formed at an edge of one side thereof; and, in a state in which the fixing member is assembled to the assembling hole, the second bent portion may be disposed to surround an edge of the key assembly to restrict the key assembly inside the assembling hole.

The fixing member further includes a fixing plate configured to be disposed between the inner wall of the assembling hole and the key assembly and a second bent portion configured to be bent at an edge of an upper portion of the fixing plate, the first bent portion may extend or be bent from both ends of the fixing plate and may be supported on the inner wall of the assembling hole together with the fixing plate to fix the fixing member inside the assembling hole, and the second bent portion may be disposed to surround the edge of the key assembly to restrict the key assembly inside the assembling hole.

In the foregoing detailed description, specific embodiments have been described. However, it will be apparent to those skilled in the art that various modifications can be made without departing from the scope of the disclosure. For example, in the description, terms such as "upper portion", "lower portion", "top", "both ends", "one end", and "one end portion" are used to refer to a part or a point of some components. Note that this is generally based on the alignment shown in the drawings for the sake of brevity of description. According to an embodiment, the term referring to a part or a point of the components may vary according to the alignment direction or the arrangement state of each component.

According to the above-described embodiments, a fixing member may be assembled to closely adhere a key assembly to an inner wall or an inner surface of a housing while a key assembly is assembled to the housing, thereby preventing damage to the sealing member during the assembly process. For example, the sealing member may be disposed in the key assembly and in close contact with the housing by the fixing member while being aligned in the assembly position, whereby the sealing member can avoid interference or friction with other structures during the assembly process. When detaching the key assembly from the housing, the fixing member may be separated first, and then the key assembly on which the sealing member is disposed may be separated, thereby preventing damage to the key assembly or the sealing member.

The fixing member may have a substantially flat plate shape and may be inserted in a direction substantially parallel to one surface in an assembly space. For example, the sealing member may be brought into close contact with another structure while being assembled only by the insertion operation, without securing a separate space in the assembling process.

While the disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. An electronic device, comprising:
   a housing including a sidewall;
   a through-hole configured to penetrate the sidewall;
   an assembling hole formed adjacent to the through-hole inside the housing;
   a key assembly configured to be received in the assembling hole and disposed to face an inner surface of the sidewall of the housing in an area where the through-hole is positioned; and
   a fixing member configured to be received in the assembling hole,
   wherein the fixing member is configured to bring a surface of the key assembly into close contact with the inner surface of the sidewall of the housing around the through-hole such that the key assembly is configured to form a waterproof structure between the through-hole and an inner space of the housing.

2. The electronic device of claim 1, wherein the key assembly comprises:
   a sealing member;
   a flexible printed circuit board;
   a switch member provided on a surface of the flexible printed circuit board and aligned with the through-hole while facing the sealing member; and
   a reinforcing member provided on an opposite surface of the flexible printed circuit board.

3. The electronic device of claim 2, wherein the key assembly further comprises a protrusion formed on the sealing member, and
   wherein the protrusion is brought into close contact with the inner surface of the housing around the through-hole.

4. The electronic device of claim 2, wherein a portion of the flexible printed circuit board or the reinforcing member faces the inner surface of the housing with the sealing member interposed therebetween, and
   wherein another portion of the flexible printed circuit board or the reinforcing member directly faces the inner surface of the housing.

5. The electronic device of claim 4, further comprising a first bent portion formed in an end of the fixing member,
   wherein, when the fixing member is coupled to the assembling hole, a portion of the first bent portion is interposed between the another portion of the flexible printed circuit board or the reinforcing member and the inner surface of the housing.

6. The electronic device of claim 4, further comprising:
   a first bent portion formed in an end of the fixing member; and
   a fixing portion configured to extend from an end of the sealing member,
   wherein, when the fixing member is coupled to the assembling hole, the first bent portion interferes with the fixing portion, and the fixing member restricts the key assembly in the assembling hole.

7. The electronic device of claim 6, wherein the first bent portion and the fixing portion face the inner surface of the housing and are positioned side by side each other.

8. The electronic device of claim 6, wherein the first bent portion is supported on an inner wall of the assembling hole when the first bent portion and the fixing portion are positioned side by side each other.

9. The electronic device of claim 2, wherein the reinforcing member comprises a protecting piece extending or bent from an edge of an upper portion at a position adjacent to both ends of the reinforcing member, and
wherein, when the fixing member is assembled in the assembling hole, the protecting piece surrounds an edge of an upper portion of the flexible printed circuit board or the sealing member.

10. The electronic device of claim 1, further comprising:
a fixing groove formed adjacent to the assembling hole inside the housing; and
a fixing piece configured to extend from a rear surface of the key assembly,
wherein the fixing piece engages with the fixing groove to restrict the movement of the key assembly.

11. The electronic device of claim 10, wherein the key assembly comprises:
a switch member aligned with the through-hole; and
a flexible printed circuit board including:
a mounting portion in which the switch member is disposed on a surface thereof, and
a connection portion extending from a side of the mounting portion, and
wherein at least a portion of the connection portion is disposed between a bottom surface of the fixing groove and the fixing piece.

12. The electronic device of claim 10, wherein the fixing member further comprises an avoidance groove formed at an edge of a side of the fixing member, and
wherein, when the fixing member is assembled to the assembling hole, the fixing piece is positioned inside the avoidance groove.

13. The electronic device of claim 1, wherein the fixing member comprises:
a fixing plate positioned to face a rear surface of the key assembly;
a first bent portion bent at both ends of the fixing plate; and
a second bent portion bent at an edge of an upper portion of the fixing plate,
wherein the first bent portion is supported on an inner wall of the assembling hole when the fixing member is assembled to the assembling hole, and the second bent portion is positioned to surround a portion of an edge of the key assembly and to restrict the key assembly inside the assembling hole.

14. The electronic device of claim 1, further comprising a button member configured to be received in the through-hole,
wherein the key assembly comprises a switch member corresponding to the button member.

15. An electronic device, comprising:
a housing including a through-hole that penetrates a sidewall of the housing and an assembling hole formed adjacent to the through-hole on an inner side of the sidewall;
a key assembly configured to be received in the assembling hole and disposed to face an inner surface of the housing in an area in which the through-hole is positioned, wherein the key assembly comprises
a sealing member configured to be brought into close contact with the inner surface of the housing,
a flexible printed circuit board coupled to the sealing member,
a switch member provided on a surface of the flexible printed circuit board and aligned with the through-hole while facing the sealing member, and
a reinforcing member coupled to another surface of the flexible printed circuit board;
a fixing member configured to be received in the assembling hole, wherein the fixing member comprises:
a fixing plate disposed between an inner wall of the assembling hole and the reinforcing member,
a first bent portion bent at both ends of the fixing plate, and
a second bent portion bent at an edge of an upper portion of the fixing plate,
wherein, when the fixing member is assembled to the assembling hole, the fixing plate and the first bent portion are supported on the inner wall of the assembling hole and the second bent portion surrounds a portion of an edge of the key assembly and restricts the key assembly inside the assembling hole, and
wherein the sealing member is brought into close contact with the inner surface of the housing around the through-hole and seals between the through-hole and an inner space of the housing.

16. An electronic device, comprising:
a housing including a front plate, a rear plate, and a side bezel structure surrounding a space between the front plate and the rear plate, wherein the side bezel structure includes an outer surface, an inner surface, and at least one through-hole extending from the outer surface to the inner surface;
an intermediate plate extending from the inner surface of the side bezel structure, between the front plate and the rear plate, wherein the intermediate plate forms an elongated recess with the side bezel structure at a position adjacent to the through-hole, when viewed from above the front plate or the rear plate, and the elongated recess includes an inner wall facing the side bezel structure and a bottom surface facing the front plate or the rear plate;
a display disposed between the intermediate plate and the front plate;
a circuit structure configured to be received in the elongated recess and to include a dome key structure disposed to face the through-hole;
an elastic member configured to be received in the elongated recess, to be disposed between the circuit structure and the inner surface of the side bezel structure, to contact the inner surface of the side bezel structure, and to seal the through-hole;
a metal member configured to be received in the elongated recess and to be disposed between an inner wall of the elongated recess and the circuit structure while contacting the inner wall of the elongated recess;
a spacer member configured to be received in the elongated recess and to contact the metal member and the circuit structure between the metal member and the circuit structure; and
a button structure configured to be received in the through-hole.

17. The electronic device of claim 16, wherein the metal member comprises stainless steel.

18. The electronic device of claim 16, wherein the spacer member comprises a metal material.

19. The electronic device of claim 16, wherein the metal member comprises a first end or a second end, and when viewed from above the front plate or the rear plate, at least one of the first end and the second end has a "U" shaped structure.

20. The electronic device of claim 19, wherein at least one of the circuit structure and the spacer member comprises an extended piece disposed between the "U" shaped structure and the bottom surface of the elongated recess.

\* \* \* \* \*